United States Patent
Jeon et al.

(10) Patent No.: US 10,658,710 B2
(45) Date of Patent: May 19, 2020

(54) SECONDARY BATTERY STRUCTURE AND SYSTEM, AND METHODS OF MANUFACTURING AND OPERATING THE SAME

(71) Applicant: SAMSUNG ELECTRONICS CO., LTD., Suwon-si, Gyeonggi-do (KR)

(72) Inventors: Woosung Jeon, Suwon-si (KR); Jeoyoung Shim, Yongin-si (KR); Gyeongsu Park, Hwaseong-si (KR); Jooho Lee, Hwaseong-si (KR); Heegoo Kim, Yongin-si (KR); Jaewoo Lee, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/174,586

(22) Filed: Oct. 30, 2018

(65) Prior Publication Data

US 2019/0067752 A1 Feb. 28, 2019

Related U.S. Application Data

(62) Division of application No. 15/071,059, filed on Mar. 15, 2016, now Pat. No. 10,177,418.

(30) Foreign Application Priority Data

Jun. 3, 2015 (KR) .......................... 10-2015-0078664

(51) Int. Cl.
*H01M 10/0585* (2010.01)
*H01M 4/131* (2010.01)
(Continued)

(52) U.S. Cl.
CPC ........ *H01M 10/4257* (2013.01); *H01L 27/12* (2013.01); *H01M 4/131* (2013.01);
(Continued)

(58) Field of Classification Search
CPC .. H01M 10/4257; H01M 4/131; H01M 4/525; H01M 10/0525; H01M 10/0436;
(Continued)

(56) References Cited

U.S. PATENT DOCUMENTS 5,567,210 A  10/1996 Bates et al.
6,586,133 B1  7/2003 Teeters et al.
(Continued)

FOREIGN PATENT DOCUMENTS

JP  2008012448 A  1/2008

OTHER PUBLICATIONS

Adriel Jebin Jacob Jebaraj et al., "Microparticle Electrodes and Single Particle Microbatteries: Electrochemical and in Situ MicroRaman Spectroscopic Studies", Accounts of chemical research, Mar. 26, 2013, pp. 1192-1205, Vo. 46, No. 5, American Chemical Society.
(Continued)

*Primary Examiner* — Muhammad S Siddiquee
(74) *Attorney, Agent, or Firm* — Cantor Colburn LLP

(57) ABSTRACT

A secondary battery structure includes a first electrode structure including a plurality of first electrode elements spaced apart from each other and disposed in a form of an array, a second electrode structure spaced apart from the first electrode structure and including a second electrode element, and an electrolyte which allows ions to move between the first electrode structure and second electrode structure, where the first electrode structure and the second electrode structure define a cathode and an anode, and the number of the first electrode elements and the number of the second electrode element are different from each other.

6 Claims, 37 Drawing Sheets

(51) Int. Cl.
| | |
|---|---|
| *H01M 6/40* | (2006.01) |
| *H01M 10/42* | (2006.01) |
| *H01L 27/12* | (2006.01) |
| *H01M 10/04* | (2006.01) |
| *H01M 4/525* | (2010.01) |
| *H01M 10/0525* | (2010.01) |
| *H02J 7/00* | (2006.01) |
| *H01M 4/02* | (2006.01) |
| *H01M 4/505* | (2010.01) |

(52) U.S. Cl.
CPC .............. *H01M 4/525* (2013.01); *H01M 6/40* (2013.01); *H01M 10/0436* (2013.01); *H01M 10/0525* (2013.01); *H01M 10/0585* (2013.01); *H02J 7/0068* (2013.01); *H01M 4/505* (2013.01); *H01M 2004/025* (2013.01); *H01M 2004/028* (2013.01); *H01M 2010/0495* (2013.01); *H01M 2010/4271* (2013.01); *H01M 2010/4278* (2013.01); *H01M 2220/30* (2013.01)

(58) Field of Classification Search
CPC .... H01M 10/0585; H01M 6/40; H01M 4/505; H01M 2004/028; H01M 2010/4271; H01M 2010/4278; H01M 2220/30; H01M 2004/025; H01M 2010/0495; H01M 4/13; H01M 10/052; H02J 7/0068; H01L 27/12
See application file for complete search history.

(56) References Cited

U.S. PATENT DOCUMENTS

| | | |
|---|---|---|
| 6,764,525 B1 | 7/2004 | Whitacre et al. |
| 7,704,615 B1 * | 4/2010 | Teeters ................ G11B 9/1472 |
| | | 429/149 |
| 2003/0211637 A1 | 11/2003 | Schoeniger et al. |
| 2008/0081256 A1 | 4/2008 | Madou et al. |
| 2012/0009331 A1 | 1/2012 | Kwon et al. |
| 2015/0128409 A1 | 5/2015 | Chen et al. |
| 2016/0187431 A1 * | 6/2016 | Yamamoto .......... H01M 10/441 |
| | | 324/426 |

OTHER PUBLICATIONS

Attila Palencsar et al., "Single-Particle Electrode Aqueous Microbatteries", Electrochemical and Solid-State Letters, Oct. 7, 2005, pp. A622-A626, The Electrochemical Society, Inc.

Joo-Seong Kim et al.,"A Half Millimeter Thick Coplanar Flexible Battery with Wireless Recharging Capability", Nano Letters, Mar. 2, 2015, pp. 2350-2357, American Chemical Society.

Kaoru Dokko et al., "High rate discharge capability of single particle electrode of LiCoO2", Journal of Power Sources, Aug. 9, 2008, pp. 783-785, Elsevier B.V.

Fride Vullum et al., Characterization of lithium nanobatteries and lithium battery nanoelectrode arrays that benefit from nanostructure and molecular self-assembly, 2006, pp. 2833-2838, 177, Solid State Ionics, Elsevier.

Extended European Search Report for Application No. 16169165.4 dated Oct. 7, 2016.

Dokko, et al., High-Rate Lithium Deintercalation from Lithiated Graphite Single-Particle Electrode, J. Phys. Chem. C 2010, 114, pp. 8646-8650.

Huang, et al., Micro-Electrode Linked Cylic Valtammetry Study Reveals Ultra-Fast Discharge and High Ionic Transfer Behavior of LiFePO4, International Journal of Electrochemical Science, 7 (2012) pp. 1205-1213.

Liu, et al., Visualization of Charge Distribution in a Lithium Battery Electrode, The Journal of Physical Chemistry Letters, 2010, 1, pp. 2120-2123.

Shi, et al., Single Particle Electrode Microbatteries, Electrochemical and Solid-State Letters, 8 (2) pp. A122-A124 (2005).

* cited by examiner

< COMPARATIVE EXAMPLE >

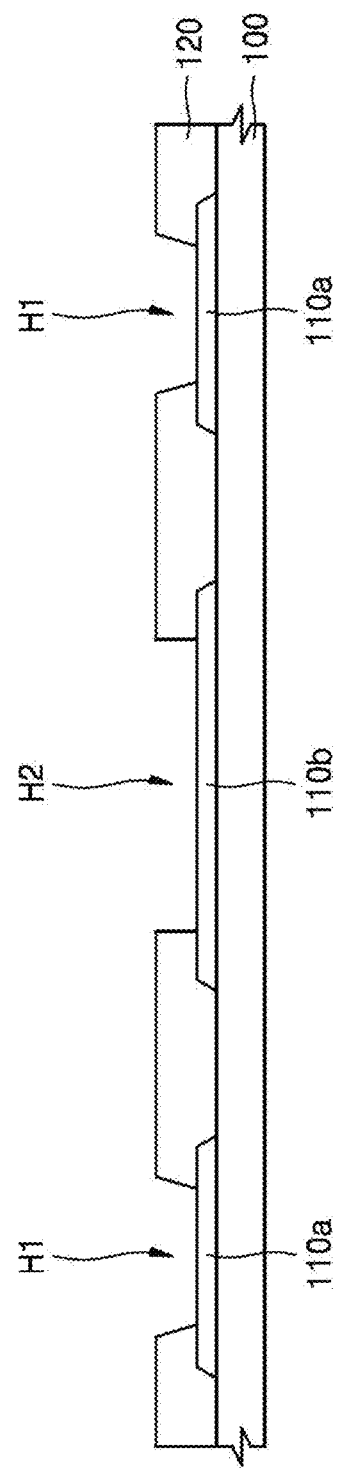

SECONDARY BATTERY STRUCTURE AND SYSTEM, AND METHODS OF MANUFACTURING AND OPERATING THE SAME

CROSS-REFERENCE TO RELATED APPLICATION

This application is a divisional of U.S. patent application Ser. No. 15/071,059, filed on Mar. 15, 2016, which claims priority to Korean Patent Application No. 10-2015-0078664, filed on Jun. 3, 2015, and all the benefits accruing therefrom under 35 U.S.C. § 119, the content of which in its entirety is herein incorporated by reference.

BACKGROUND

1. Field

The disclosure relates to a battery structure and a battery system, and more particularly, to a secondary battery structure, a battery system including the secondary battery structure, and methods of manufacturing and operating the secondary battery structure or the battery system including the secondary battery structure.

2. Description of the Related Art

A secondary battery is a rechargeable battery capable of charging and discharging, unlike a primary battery that is not rechargeable, and has been widely used for various electronic devices such as mobile phones, notebook computers, or camcorders. In particular, a lithium secondary battery exhibits a high voltage and a high energy density per unit weight, which are merits compared to a nickel-cadmium battery or a nickel-hydrogen battery, and a demand therefor has been increased. A lithium secondary battery may be classified into a liquid electrolyte battery and a polymer electrolyte battery according to the type of an electrolyte in use. A battery using a liquid electrolyte is referred to as a lithium ion battery and a battery using a polymer electrolyte is referred to as a lithium polymer battery.

As a kind of electronic apparatuses adopting secondary batteries is diversified and related markets are growing, a demand for improvement of performance, such as, improvement of stability and durability, increase of capacity, or achievement of flexibility, of a secondary battery, has been increased. Also, a demand for small/ultra-small secondary batteries that are usable as power sources of micro-devices such as ultra-small precision mechanical parts or a micro-electromechanical system ("MEMS"), smart cards, or memory devices, has been increased. In addition, there has been a demand for a method of improving efficiency of research and development of a secondary battery.

SUMMARY

The disclosure relates to a small/thin film secondary battery structure.

The disclosure relates to a secondary battery structure with high performance.

The disclosure relates to secondary battery structures having high stability and durability.

The disclosure relates to technology, structure and method for efficiently performing analysis and evaluation with respect to materials for a secondary battery.

The disclosure relates to a method of manufacturing the secondary battery structure.

The disclosure relates to a method of operating the secondary battery structure.

The disclosure relates to an analysis and evaluation method using the secondary battery structure.

The disclosure relates to a battery system including the secondary battery structure, and an operation method thereof.

According to an exemplary embodiment, a secondary battery structure includes a first electrode structure including a plurality of first electrode elements spaced apart from each other, a second electrode structure spaced apart from the first electrode structure and having a second electrode element, and an electrolyte which allows ions to move between the first electrode structure and second electrode structure, in which the first electrode structure and the second electrode structure define a cathode and an anode, and the number of the first electrode elements and the number of the second electrode element are different from each other.

In an exemplary embodiment, the first electrode structure may be the cathode and the second electrode structure may be the anode, or the first electrode structure may be the anode and the second electrode structure may be the cathode.

In an exemplary embodiment, the plurality of first electrode elements may be electrochemically and parallelly connected to the second electrode element via the electrolyte.

In an exemplary embodiment, the plurality of first electrode elements may be disposed in a form of an array. The plurality of first electrode elements may include a plurality of microelectrodes, which collectively defines a microelectrode array.

In an exemplary embodiment, the plurality of first electrode elements may further include a plurality of active material elements disposed on the plurality of microelectrodes.

In an exemplary embodiment, each of the plurality of active material elements may have a particle structure, and each of the plurality of microelectrodes may have a size equal to or greater than about 1 square micrometer.

In an exemplary embodiment, the plurality of active material elements may include at least two different materials.

In an exemplary embodiment, the plurality of active material elements may have at least two different sizes.

In an exemplary embodiment, an active material element of the plurality of active material elements may include a plurality of particles.

In an exemplary embodiment, the secondary battery structure may further include a plurality of welding portions which binds each of the active material elements to a corresponding microelectrode of the plurality of microelectrodes.

In an exemplary embodiment, the secondary battery structure may further include a conductive adhesive layer disposed between each of the active material elements and the corresponding microelectrode of the plurality of microelectrodes.

In an exemplary embodiment, the secondary battery structure may further include a pressing member which applies a pressure to each of the active material elements.

In an exemplary embodiment, the plurality of microelectrodes may include at least one selected from platinum (Pt), gold (Au), copper (Cu), palladium (Pd), nickel (Ni), titanium (Ti), chromium (Cr), iron (Fe), cobalt (Co), aluminum (Al) and carbon (C).

In an exemplary embodiment, the plurality of active material elements may include a lithium (Li) metal oxide.

In an exemplary embodiment, the second electrode structure may include a single second electrode element.

In an exemplary embodiment, the second electrode structure may include a plurality of second electrode elements, and the number of the second electrode elements may be less than the number of the first electrode elements.

In an exemplary embodiment, the second electrode element may include a second electrode portion and a second active material element contacting the second electrode portion.

In an exemplary embodiment, the plurality of first electrode elements and the second electrode element may be arranged spaced apart in a horizontal direction perpendicular to a thickness direction.

In an exemplary embodiment, the secondary battery structure may further include a substrate, on which the plurality of first electrode elements and the second electrode element are disposed, and an insulation layer disposed on the substrate, where openings, which expose portions of the plurality of first electrode elements and a portion of the second electrode element, may be defined in the insulation layer, and the electrolyte may be disposed on the insulation layer and contact the exposed portions of the plurality of first electrode elements and the exposed portion of the second electrode element.

In an exemplary embodiment, the secondary battery structure may further include a substrate, on which the plurality of first electrode elements is disposed, and an insulation layer disposed on the substrate, where openings, which expose portions of the plurality of first electrode elements, may be defined in the insulation layer, the second electrode element may be disposed on the insulation layer, and the electrolyte may be disposed on the insulation layer and contact the exposed portions of the plurality of first electrode elements and the second electrode element.

In an exemplary embodiment, the plurality of first electrode elements and the second electrode element may be arranged spaced apart in a thickness direction.

In an exemplary embodiment, the first electrode structure may further include a plurality of first contact pads connected to the plurality of first electrode elements, and the second electrode structure may further include a second contact pad connected to the second electrode element.

In an exemplary embodiment, the secondary battery structure may further include a first substrate, on which the plurality of first electrode elements and the second electrode element are disposed, and a second substrate opposite to the first substrate, where the second substrate may include a plurality of pin structures which provides a pressure against the plurality of first electrode elements and the second electrode element.

In an exemplary embodiment, the secondary battery structure may further include a separator disposed between the plurality of first electrode elements and the second electrode element, where the second electrode element is disposed on the plurality of first electrode elements, and a substrate disposed on the plurality of first electrode elements, where the substrate may include a plurality of pin structures which provides a pressure against the plurality of first electrode elements.

In an exemplary embodiment, an active material area of a first electrode element of the plurality of first electrode elements may be smaller than an active material area of the second electrode element.

In an exemplary embodiment, the secondary battery structure may be a single cell structure.

According to another exemplary embodiment, a secondary battery structure may include a first electrode structure, a second electrode structure spaced apart from the first electrode structure, and an electrolyte which allows ions to move between the first electrode structure and the second electrode structure, in which one of the first electrode structure and the second electrode structure may be a cathode and the other of the first electrode structure and the second electrode structure may be a anode, and at least one of the first electrode structure and the second electrode structure may include a microelectrode array.

In an exemplary embodiment, the at least one of the first electrode structure and the second electrode structure may further include a plurality of active material elements disposed on the microelectrode array.

In an exemplary embodiment, an active material element of the active material elements may have a particle structure.

In an exemplary embodiment, each of the first electrode structure and the second electrode structure may include a unit electrode, and the number of the unit electrode of the first electrode structure and the number of the unit electrode of the second electrode structure may be different from each other.

In an exemplary embodiment, the secondary battery structure may further includes a substrate, on which the first electrode structure and the second electrode structure are arranged, where the first electrode structure and the second electrode structure may be spaced apart in a direction perpendicular to a thickness direction of the substrate.

In an exemplary embodiment, the first electrode structure and the second electrode structure may be arranged spaced apart in a vertical direction with respect to a plane in which the microelectrode array is arranged.

According to another exemplary embodiment, a secondary battery structure includes a first electrode provided on a substrate, an insulation layer disposed on the substrate and which covers the first electrode, where an opening, which exposes a portion of the first electrode, is defined in the insulation layer, a first active material element disposed on the exposed portion of the first electrode, a second active material element disposed on the substrate and spaced apart from the first active material element in a horizontal direction, where the second active material element includes a material different from a material of the first active material element, and an electrolyte disposed on the insulation layer and contacting the first active material element and the second active material element.

In an exemplary embodiment, the secondary battery structure may further include a second electrode arranged on the substrate and spaced apart from the at least one first electrode in a horizontal direction, an opening, which exposes a portion of the second electrode, is defined in the insulation layer, and the second active material element may be disposed on the exposed portion of the second electrode.

In an exemplary embodiment, the first electrode and the second electrode may include a same material.

In an exemplary embodiment, the second active material element may be disposed on a surface of the insulation layer.

In an exemplary embodiment, the first active material element may have a particle structure.

In an exemplary embodiment, the secondary battery structure may further include a welding portion which binds the first active material element to the first electrode.

In an exemplary embodiment, the secondary battery structure may further include a conductive adhesive layer between the first active material element and the first electrode, in which the conductive adhesive layer binds the first active material element and the first electrode.

In an exemplary embodiment, the second active material element may have a thin film structure.

In an exemplary embodiment, the secondary battery structure may further include a guide pattern on the insulation layer, in which the electrolyte is provided inside of the guide pattern.

In an exemplary embodiment, the secondary battery structure may further include a cover layer disposed on the electrolyte, in which a portion of the cover layer corresponding to the first active material element protrudes toward the substrate.

In an exemplary embodiment, the secondary battery structure may include a plurality of first electrodes, in which the plurality of first electrodes may define a microelectrode array.

In an exemplary embodiment, the secondary battery structure may further include a pin structure which electrically contacts and applies a pressure to the first active material element or the second active material element.

According to another exemplary embodiment, a single battery structure includes a plurality of first electrode elements spaced apart from each other, a second electrode element spaced apart from the plurality of first electrode elements, a plurality of first electrode terminals connected to the plurality of first electrode elements, and a second electrode terminal connected to the at least one second electrode element, in which one of the first electrode terminals and the second electrode terminal is a cathode terminal and the other of the first electrode terminals and the second electrode terminal is an anode terminal.

In an exemplary embodiment, the number of the second electrode element and the number of the first electrode elements may be different from each other.

In an exemplary embodiment, the plurality of first electrode elements may be electrochemically and parallelly connected to the second electrode element via an electrolyte.

In an exemplary embodiment, the single battery structure may be a secondary battery structure.

According to another exemplary embodiment, a battery system includes the single battery structure and a battery management system connected to the single battery structure.

In an exemplary embodiment, the battery management system may include a first switching circuit unit connected to the plurality of first electrode terminals, a second switching circuit unit connected to the second electrode terminal, and a battery management controller connected to the first and second switching circuit units, where the battery management controller controls operations of the first and second switching circuit units.

BRIEF DESCRIPTION OF THE DRAWINGS

These and/or other features of embodiments of the invention will become apparent and more readily appreciated from the following description of the exemplary embodiments, taken in conjunction with the accompanying drawings, in which:

FIGS. 34A to 34E are cross-sectional views illustrating a method of manufacturing a secondary battery structure according to an exemplary embodiment;

DETAILED DESCRIPTION

Figure 1:
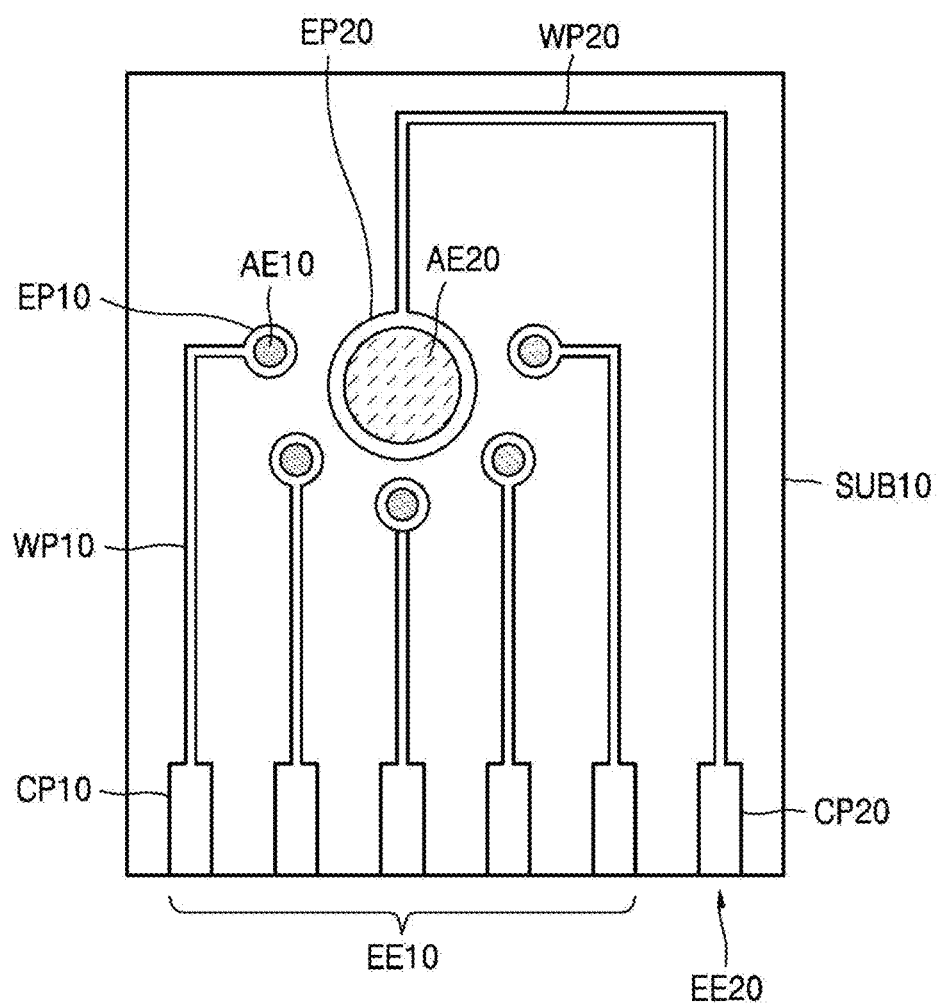
FIG. 1 is a plan view of a secondary battery structure according to an exemplary embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. "Or" means "and/or." It will be further understood that the terms "comprises" and/or "comprising," or "includes" and/or "including" when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Exemplary embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The inventive concept will now be described more fully with reference to the accompanying drawings, in which exemplary embodiments of the inventive concept are shown. In the drawings, the thicknesses of layers and regions are exaggerated for clarity. Like reference numerals in the drawings denote like elements.

FIG. 1 is a plan view of a secondary battery structure according to an exemplary embodiment.

Referring to FIG. 1, an exemplary embodiment of a secondary battery may include a structure in which a plurality of first electrode elements EE10 arranged on a substrate SUB10 and spaced apart from each other. The secondary battery structure may further include a second electrode element EE20 (e.g., at least one second electrode element) spaced apart from the first electrode elements EE10. In an exemplary embodiment, the secondary battery structure may include a single second electrode element EE20. In such an embodiment, the first electrode elements EE10 correspond to the single second electrode element EE20. The first electrode elements EE10 may define a first electrode structure, and the second electrode element EE20 may defined a second electrode structure. In such an embodiment, the first electrode structure, or the first electrode elements EE10, may be a cathode, and the second electrode structure, or the second electrode element EE20, may be an anode, or vice versa.

An electrolyte (ET10 of FIG. 2) may be provided on the substrate SUB10 for the movement of ions between the first electrode elements EE10 and the second electrode element EE20. The first electrode elements EE10 may be electrochemically and parallelly connected to the second electrode element EE20 through the electrolyte (ET10 of FIG. 2). In such an embodiment, the first electrode elements EE10 are spaced apart from each other without any connection portion therebetween, such that the first electrode elements EE10 may be independently controlled.

In an exemplary embodiment, the first electrode elements EE10 may include a microelectrode array ("MEA") including a plurality of microelectrodes. In such an embodiment, each of the first electrode elements EE10 may include a microelectrode, and the plurality of microelectrodes corresponding to the first electrode elements EE10 may define an array. Herein, the term "microelectrode" may have a broad meaning including not only a microscale electrode, but also a nanoscale electrode. In some embodiments, the term "microelectrode" may refer to a fine electrode (ultra-small electrode) having a size or area equal to or greater than about 1 square micrometer ($\mu m^2$). The microelectrodes may be arranged in two dimensions forming the MEA.

Each of the first electrode elements EE10 may include a first electrode portion EP10. A first active material element AE10 may be disposed on the first electrode portion EP10. Each of the first electrode elements EE10 may include a first wiring portion WP10 extending from the first electrode portion EP10, and a first contact pad CP10 may be disposed at an end portion of the first wiring portion WP10. The first wiring portion WP10 may electrically connect the first active material element AE10 and the first contact pad CP10 corresponding thereto. In an exemplary embodiment, the first electrode portion EP10, where the first active material element AE10 is disposed, may have a size or width larger than the first wiring portion WP10, or equal to or similar to the first wiring portion WP10. In one exemplary embodiment, for example, the first electrode portion EP10 may have a size or area equal to or greater than about 1 $\mu m^2$. In such an embodiment, similarly to the first electrode elements EE10, the second electrode element EE20 may include a second electrode portion EP20, and a second active material element AE20 may be disposed on the second electrode portion EP20. A second wiring portion WP20 may extend from the second electrode portion EP20. A second contact pad CP20 may be disposed at an end portion of the second wiring portion WP20. In an exemplary embodiment, as shown in FIG. 1, a plurality of first active material elements AE10 may be arranged around the second active material element AE20. In an exemplary embodiment, an active material area of the first active material elements AE10 is smaller than an active material area of the second electrode element AE20. In such an embodiment, an area of each of the first active material elements AE10 may be smaller than that of the second active material element AE20. Herein, an area of an active material element may be defined as an area occupied by the active material element. The first contact pad CP10 and the second contact pad CP20 may be connected to an external charge/discharge terminal (not shown).

FIG. 1 merely shows the first electrode elements EE10 and the second electrode element EE20 in an exemplary embodiment, and the arrangement form, number, positional relation or size and shape of each part of the first electrode elements EE10 and the second electrode element EE20 may be modified in various ways in an alternative embodiment.

Figure 2:
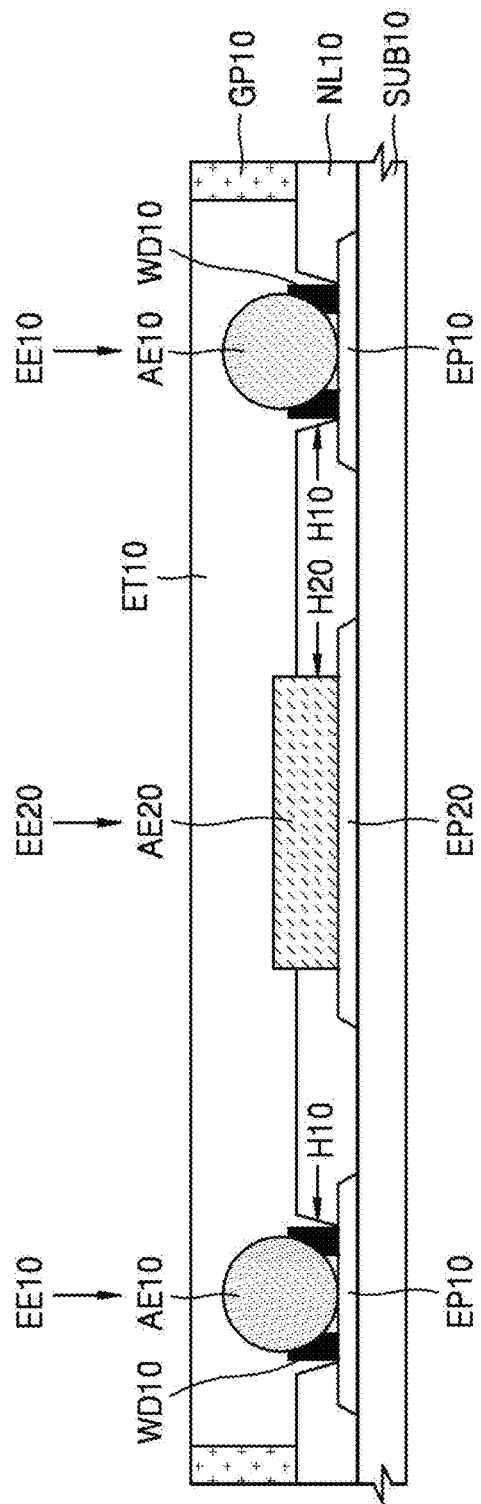
FIG. 2 is a cross-sectional view exemplarily illustrating a sectional structure of a partial area of FIG. 1.

FIG. 2 is a cross-sectional view exemplarily illustrating a sectional structure of a partial area of FIG. 1.

Referring to FIG. 2, the first electrode elements EE10 may be disposed on the substrate SUB10. A second electrode element EE20 may be disposed on the substrate SUB10. Each of the first electrode elements EE10 may include the first electrode portion EP10 and the first active material element AE10 contacting the first electrode portion EP10. The second electrode element EE20 may include the second electrode portion EP20 and the second active material element AE20 contacting the second electrode portion EP20. In an exemplary embodiment, a plurality of first electrode portions EP10 and a second electrode portion EP20 may be arranged on the substrate SUB10, and spaced apart from each other in a horizontal direction, e.g., a direction perpendicular to a thickness direction of the substrate SUB10. An insulation layer NL10 may be disposed on the substrate SUB10 to cover the first and second electrode portions EP10 and EP20. The insulation layer NL10 may include at least one of various insulation materials including, for example, silicon oxide ($SiO_2$), silicon nitride (SiNx), aluminum oxide ($Al_2O_3$) and an insulation polymer material. The insulation layer NL10 may function as a passivation layer or a protective layer. Openings H10 and H20 that respectively expose the first and second electrode portions EP10 and EP20 may be defined in the insulation layer NL10. The opening H10 that exposes a portion of the first electrode portion EP10 is referred to as the first opening, and the opening H20 that exposes the second electrode portion EP20 is referred to as the second opening. The diameter of each of the first and second openings H10 and H20 may in a range from several to several hundred micrometers, for example, in a range from about 10 micrometers (µm) to about 100 µm. The first active material element AE10 may be disposed in the first the opening H10, and the second active material element AE20 may be disposed in second opening H20. An electrolyte ET10 contacting the first and second active material elements AE10 and AE20 may be disposed on the insulation layer NL10. The electrolyte ET10 may be in a predetermined guide pattern GP10. The guide pattern GP10 may be disposed on the insulation layer NL10 at or along an edge of the substrate Sub10. The electrolyte ET10 may be disposed inside of the guide pattern GP10. In an alternative embodiment, the guide pattern GP10 may be omitted.

In an exemplary embodiment, the insulation layer NL10 covers the first and second electrode portions EP10 and EP20, and may prevent or minimize electrochemical connection between the first and second electrode portions EP10 and EP20. In such an embodiment, the insulation layer NL10 may allow the electrolyte ET10 not to contact, or hardly contact, the first and second electrode portions EP10 and EP20. Accordingly, the first and second electrode portions EP10 and EP20 may hardly contribute to an electrochemical reaction via the electrolyte ET10 such that during the charge/discharge of a secondary battery, the influence of metal such as the first and second electrode portions EP10 and EP20 may be minimized or reduced. The electrochemical reaction, that is, an ion exchange reaction, for the charge/discharge, may mainly occur between the active material elements AE10 and AE20 and the electrolyte ET10. Accordingly, in such an embodiment, the charge/discharge characteristics of a secondary battery may be improved.

The first and second electrode portions EP10 and EP20 may include a same material as each other. In one exemplary embodiment, for example, the first and second electrode portions EP10 and EP20 may include at least one selected from platinum (Pt), gold (Au), copper (Cu), palladium (Pd), nickel (Ni), titanium (Ti), chromium (Cr), iron (Fe), cobalt (Co), aluminum (Al) and carbon (C). In such an embodiment, the first and second electrode portions EP10 and EP20 may include a material including carbon (C), e.g., graphene or graphite. The first and second electrode portions EP10 and EP20 may have a single layer structure or a multilayer structure having two or more layers. In one exemplary embodiment, for example, the first and second electrode portions EP10 and EP20 may have a double-layer structure including a Ti layer and a Pt layer on the Ti Layer. In such an embodiment, the Ti layer may be a metal having a high adhesive force with respect to the substrate SUB10, and the Pt layer may be a metal contacting the first and second active material elements AE10 and AE20. However, the double-layer structure, that is, a Ti/Pt structure, is merely exemplary and detailed structures of the first and second electrode portions EP10 and EP20 may be modified in various ways. In such an embodiment, where the first and second electrode portions EP10 and EP20 include the same material as each other, one of the first and electrode portions EP10 and EP20 may function as a cathode portion and the other of the first and electrode portions EP10 and EP20 may function as an anode portion, depending on a material of the first and second active material elements AE10 and AE20. The first and second electrode portions EP10 and EP20 may include different materials from each other. In an exemplary embodiment, where the first electrode portion EP10 is a cathode portion and the second electrode portion EP20 is an anode portion, a material suitable for a cathode current collector may be used for the first electrode portion EP10 and a material suitable for an anode current collector may be used for the second electrode portion EP20. The thickness of each of the first and second electrode portions EP10 and EP20 may be in a range of about 10 nanometers (nm) to about 1000 nm.

In an exemplary embodiment, the first active material element AE10 may have, for example, a particle structure. In such an embodiment, the first active material element AE10 may be defined by a single particle. The diameter of a particle may be in a range of about 1 µm to about 100 µm, for example, in a range of about 5 µm to about 30 µm. In an alternative embodiment, the diameter of a particle may be less than about 1 µm. According to an exemplary embodiment, where the secondary battery structure is a lithium secondary battery and the first active material element AE10 is a cathode active material, the first active material element AE10 may include, for example, a lithium (Li) metal oxide. In such an embodiment, the Li metal oxide may be, for example, $Li_2MnO_3$, $Li_2CoO_3$, $LiCoO_2$, $LiFePO_4$, or an over-lithiated oxide ("OLO"). Any material that may be used as cathode active material in a secondary battery may be used for the first active material element AE10. The first active material element AE10 may contact a surface of the first electrode portion EP10. In an exemplary embodiment, the first active material element AE10 may directly contact the first electrode portion EP10 without intervening of another material such as a binder between the first active material element AE10 and the first electrode portion EP10. Accordingly, in such an embodiment, electron movement characteristics between the first active material element AE10 and the first electrode portion EP10 may be improved, such that the charge/discharge characteristics of a secondary battery structure may be improved. When an adhesive material including a binder is formed between the active material layer and an electrode, or the active material layer, that is, a layer including a large amount of active material particles and binders, by using a paste obtained by mixing active material powder and the binder, the movements of electrons and ions between the active material layer and the electrode, and between the active material particles may be hindered by the binder. Accordingly, a charge/discharge speed may be slowed down, and thus the charge/discharge characteristics may be deteriorated. However, in an exemplary embodiment, the first active material element AE10 may be a single particle, and the first active material element AE10 may directly contact the first electrode portion EP10, such that a secondary battery structure may have high charge/discharge characteristics.

In an exemplary embodiment, where the first active material element AE10 has a particle structure or a structure similar thereto, a fixing member or a binding member that fixes (or binds) the first active material element AE10 to the first electrode portion EP10 may be further included in the secondary battery structure. In one exemplary embodiment, for example, the fixing member or a binding member may be a welding portion WD10 that binds the first active material element AE10 to the first electrode portion EP10 corresponding thereto. The welding portion WD10 may include or be formed of a predetermined metal by using, for example, focused ion beam ("FIB") equipment. In an alternative embodiment, the configuration of the fixing member or a binding member is not limited to that described above, but may be changed in various ways. Alternative exemplary embodiments of the fixing member or a binding member will be described later in detail with reference to FIGS. 9, 12 and 15.

The second active material element AE20 may have, for example, a thin film or thin section shape. According to an exemplary embodiment, where the secondary battery structure is a lithium secondary battery and the second active material element AE20 is an anode active material, the second active material element AE20 may include at least one material selected from, for example, lithium (Li), silicon (Si) and carbon (C). In one exemplary embodiment, for example, the second active material element AE20 may be a Li thin film, but not being limited thereto. In an alternative embodiment, any material that may be used as an anode active material in a secondary battery may be used as the second active material element AE20. In an exemplary embodiment, the first and second active material elements AE10 and AE20 may have different structures from each other as shown in FIG. 2, but not being limited thereto. In an alternative embodiment, the first and second active material elements AE10 and AE20 may have substantially the same shape, or a similar shape, as each other.

An exemplary embodiment of the secondary battery structure described with reference to FIGS. 1 and 2 may define a single cell structure. In such an embodiment, the first electrode elements EE10 may be electrochemically connected in parallel to the second electrode element EE20 via the electrolyte ET10. In such an embodiment, the number of the first electrode elements EE10 and the number of the second electrode element EE20 may be different from each other. In such an embodiment, the number of the first active material element AE10 and the number of the second active material element AE20 may be different from each other. The difference in the number between the first electrode elements EE10 and the second electrode element EE20 may be two or more, or may be ten or more. Such an embodiment of the secondary battery structure may have a structure that is totally different from a conventional battery pack, in which a plurality of battery cells is electrically connected to each other. In such a conventional battery pack, a single cathode element, a single anode element and an electrolyte therebetween constitute a single cell, and a plurality of cells is connected to each other to define a battery pack. In such a conventional battery pack, a second electrode, e.g., a second electrode of a first cell, is not electrochemically connected to all of a plurality of first electrodes, e.g., both of a first electrode of the first cell and a first electrode of a second cell, via the electrolyte. Accordingly, the conventional battery pack may have a structure that is different from an embodiment of the secondary battery structure, in which all of the first electrode elements EE10 are electrochemically connected to the second electrode element EE20 (e.g., a single second electrode element EE20) via the electrolyte.

Figure 3:
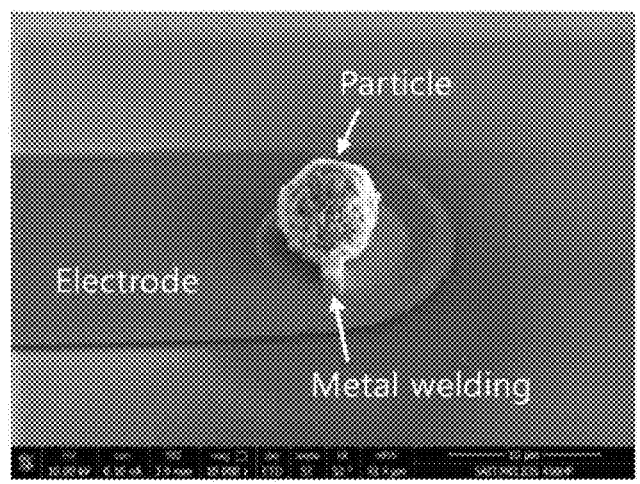
FIG. 3 is a scanning electron microscope ("SEM") image showing a case in which an active material element of a single particle structure is formed on an electrode, according to an exemplary embodiment.

FIG. 3 is a scanning electron microscope ("SEM") image showing a case in which an active material element having a single particle structure is disposed on an electrode, according to an exemplary embodiment.

Referring to FIG. 3, in an exemplary embodiment, an active material element having a single particle structure may be disposed on an electrode. A welding portion (e.g., a metal welding) may be disposed at a lower side of the active material element (single particle). In such an embodiment, although not illustrated in FIG. 3, an insulation layer covering the electrode is provided, and an opening, e.g., a hole, for exposing a portion of the electrode is defined in or through the insulation layer. The active material element (single particle) may be disposed in the portion of the electrode that is exposed by the opening.

Figure 4:
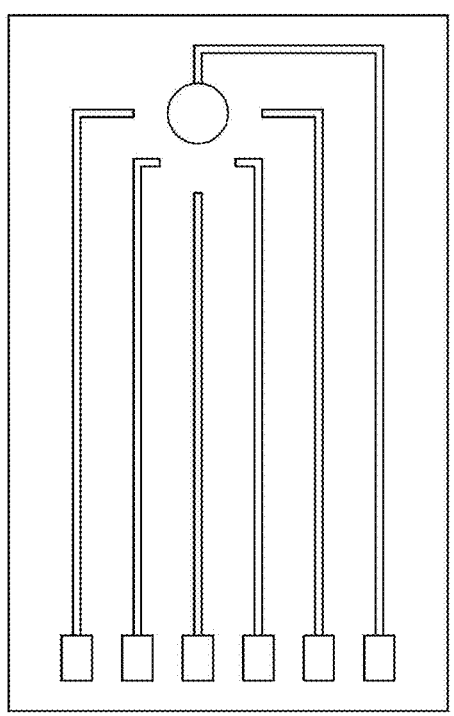
FIG. 4 is an image showing a secondary battery structure manufactured according to an exemplary embodiment.

FIG. 4 is an image showing a secondary battery structure manufactured according to an exemplary embodiment. The secondary battery structure shown in FIG. 4 is similar to the secondary battery structure described above with reference to FIG. 1. However, FIG. 4 merely shows an exemplary embodiment, and the structure thereof may be modified in various ways as described herein.

Figure 5:
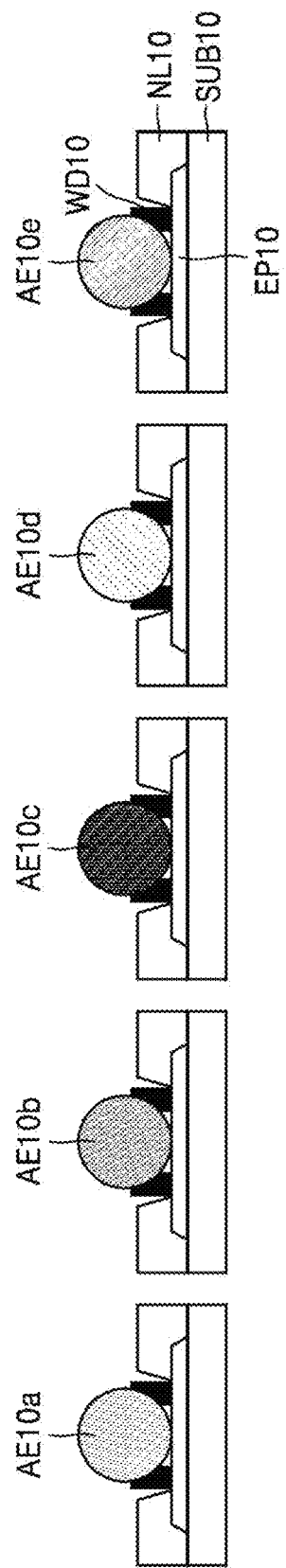
FIG. 5 is a cross-sectional view showing various embodiments of the active material element of a secondary battery structure.

FIG. 5 is a cross-sectional view showing various embodiments of the active material element of a secondary battery structure, according to the invention.

Referring to FIG. 5, various embodiments of the active material element AE10a, AE10b, AE10c, AE10d, and AE10e including different materials from each other may be applied to the secondary battery structure according to an exemplary embodiment. Such embodiments of the active material element AE10a, AE10b, AE10c, AE10d, and AE10e shown in FIG. 5 may be used, for example, as the first active material elements AE10 of an exemplary embodiment described above with reference to FIG. 1. In FIG. 5, SUB10, EP10, NL10 and WD10 refer to a substrate, an electrode portion, an insulation layer and a welding portion, respectively.

Figure 6:
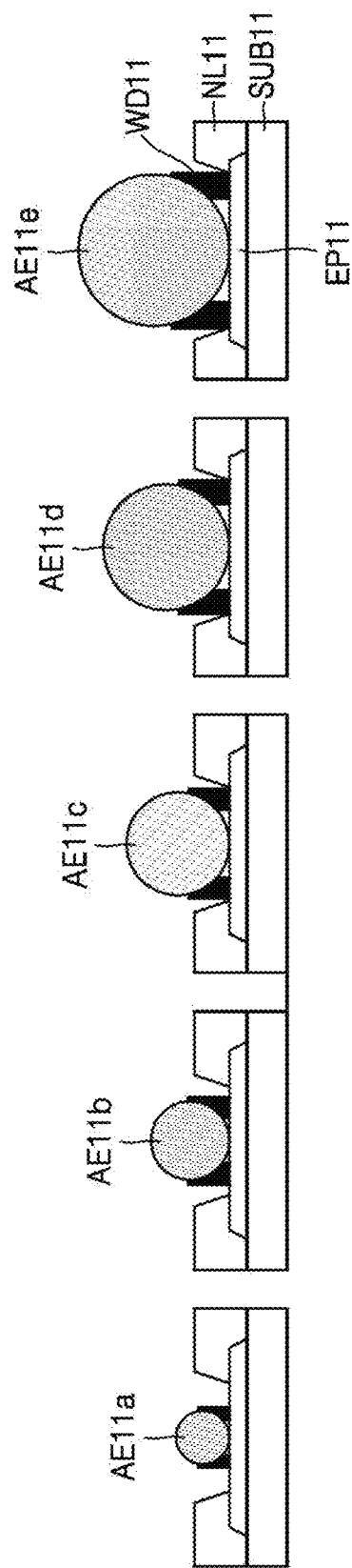
FIG. 6 is a cross-sectional view showing various embodiments of the active material element of a secondary battery structures.

FIG. 6 is a cross-sectional view showing alternative embodiments of the active material element of a secondary battery structures.

Referring to FIG. 6, various embodiments of the active material element AE11a, AE11b, AE11c, AE11d and AE11e having different sizes may be applied to the secondary battery structure according to an exemplary embodiment. Such embodiments of the active material element AE11a, AE11b, AE11c, AE11d, and AE11e shown in FIG. 6 may be used, for example, as the first active material elements AE10 of an exemplary embodiment described above with reference to FIG. 1. In FIG. 6, SUB11, EP11, NL11, and WD11 refer to a substrate, an electrode portion, an insulation layer, and a welding portion, respectively.

Figure 7:
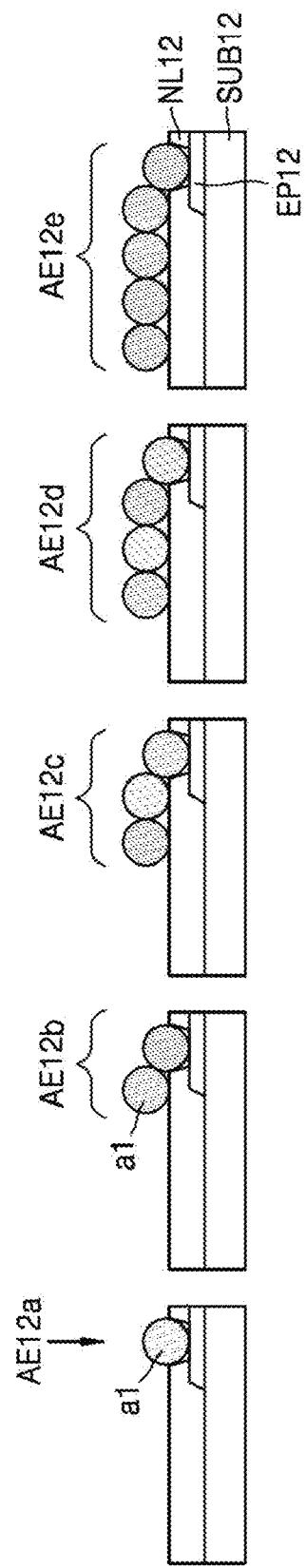
FIG. 7 is a cross-sectional view showing alternative embodiments of the active material element that are usable for a secondary battery structures.

FIG. 7 is a cross-sectional view showing alternative embodiments of the active material element of a secondary battery structures.

Referring to FIG. 7, the secondary battery structure according to an exemplary embodiment may include a plurality of the active material elements AE12a, AE12b, AE12c, AE12d and AE12e, and at least one of the active material elements AE12a, AE12b, AE12c, AE12d, and AE12e may include a plurality of unit structure a1. The unit structure a1 may be defined by, for example, a single particle. In such an embodiment, at least two of the active material elements AE12a, AE12b, AE12c, AE12d and AE12e may include a different number of the unit structures a1. In an exemplary embodiment, only one unit structure a1 of each of the active material elements AE12a, AE12b, AE12c, AE12d and AE12e may contact an electrode portion EP12 and the remaining unit structures a1 thereof may be serially connected to the one unit structure a1 contacting the electrode portion EP12. However, this is merely exemplary and the structure may be modified in various ways. Although not illustrated, a welding portion for binding the electrode portion EP12 and the unit structure a1 contacting the electrode portion EP12 may be further included in the secondary battery structure. Such an embodiment of the active material element AE12a, AE12b, AE12c, AE12d, and AE12e shown in FIG. 7 may be used, for example, as the first active material elements AE10 of an exemplary embodiment described above with reference to FIG. 1. In FIG. 7, SUB12 and NL12 refer to a substrate and an insulation layer, respectively.

Figure 8:
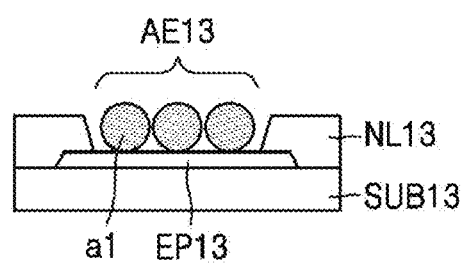
FIG. 8 is a cross-sectional view showing another alternative embodiment of the an active material element of a secondary battery structure.

FIG. 8 is a cross-sectional view showing another alternative embodiment of an active material element of a secondary battery structure.

Referring to FIG. 8, an active material element AE13 may include a plurality of unit structures a1 corresponding to one electrode portion EP13. Each of the unit structures a1 may be defined by, for example, a single particle. In such an embodiment, each of the unit structures a1 may contact the electrode portion EP13. The unit structures a1 may contact each other or may not contact each other. Such an embodiment of the active material element AE13 may be used, for example, as one of the first active material elements AE10 of an exemplary embodiment described above with reference to FIG. 1. In FIG. 8, SUB13 and NL13 refer to a substrate and an insulation layer, respectively. FIG. 8 illustrates an embodiment in which a plurality of unit structures a1 has a monolayer structure, but not being limited thereto. In an alternative embodiment, the plurality of unit structures a1 may be disposed in a plurality of layers to have a multilayer structure.

Figure 9:
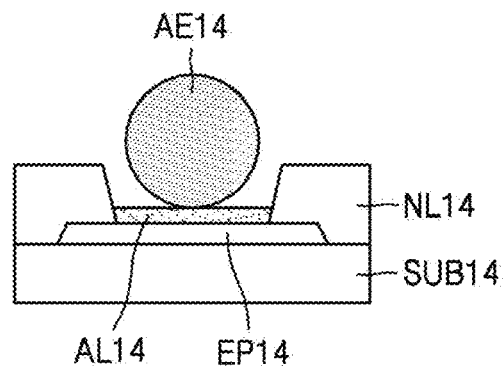
FIG. 9 is a cross-sectional view showing another alternative embodiment of the an active material element of a secondary battery structure.

FIG. 9 is a cross-sectional view showing another alternative embodiment of an active material element of a secondary battery structure.

Referring to FIG. 9, in an exemplary embodiment, an active material element AE14 may be disposed on an electrode portion EP14. In such an embodiment, a predetermined conductive adhesive layer AL14 may be further disposed between the electrode portion EP14 and the active material element AE14. The conductive adhesive layer AL14 may include a conductive material and an adhesive material. The conductive material may include, for example, carbon (C), and the adhesive material may include, for example, polymer. The adhesive material may be a material of a binder or a material similar thereto. The conductive adhesive layer AL14, which includes the conductive material, may have relatively high electrically conductive characteristics. The conductive adhesive layer AL14 may be disposed between the first electrode portion EP10 and the first active material element AE10 of FIG. 2. In such an embodiment, the welding portion WD10 may be omitted. In such an embodiment, the conductive adhesive layer AL14 may be disposed between the second electrode portion EP20 and the second active material element AE20 of FIG. 2. In FIG. 9, SUB14 and NL14 refer to a substrate and an insulation layer, respectively.

Figure 10:
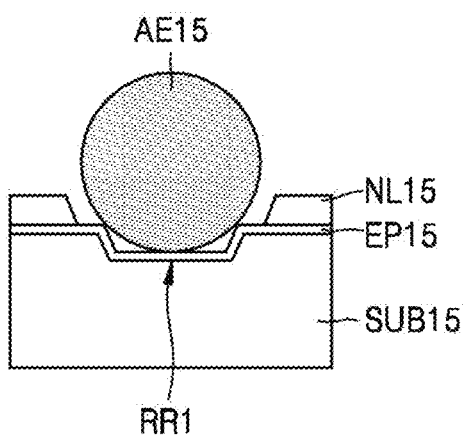
FIG. 10 is a cross-sectional view showing another alternative embodiment of the an active material element of a secondary battery structure, and a structure of a substrate corresponding thereto.

FIG. 10 is a cross-sectional view showing an embodiment of an active material element of a secondary battery structure, and a structure of a substrate corresponding thereto.

Referring to FIG. 10, a recessed region (etched region) RR1 may be formed or defined on a substrate SUB15 by etching a part of the substrate SUB15, and then, an active material element AE15 in a particle shape may be disposed in the recessed region RR1. An electrode portion EP15 may be disposed, as a conductive layer, on a surface of the substrate SUB15 where the recessed region RR1 is defined, and then, an insulation layer NL15, in which an opening corresponding to the recessed region RR1 is defined, may be disposed on the electrode portion EP15. The active material element AE15 may be located on the electrode portion EP15 of the recessed region RR1 that is exposed by the opening. The recessed region RR1 may have an inclined etched surface (inner side surface). As such, when the active material element AE15 is arranged in the recessed region, a position of the active material element AE15 may be effectively controlled or secured, e.g., fixed. In such an embodiment, a contact area between the active material element AE15 and the electrode portion EP15 increases, such that charge/discharge characteristics may be improved.

Figure 11:
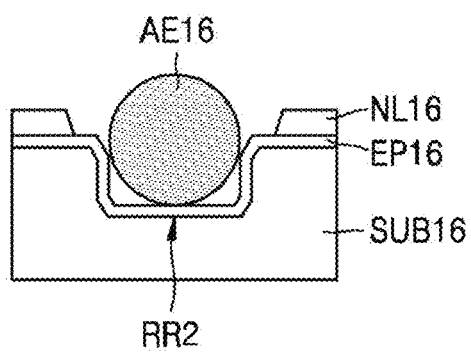
FIG. 11 is a cross-sectional view illustrating another alternative embodiment of the active material element of a secondary battery structure, and a structure of a substrate corresponding thereto.

FIG. 11 is a cross-sectional view illustrating another alternative embodiment of the active material element of a secondary battery structure, and a structure of a substrate corresponding thereto.

In an alternative embodiment, as shown in FIG. 11, the recessed region RR1 may be formed deeper than that shown in FIG. 10. FIG. 11 illustrates a modified embodiment of FIG. 10.

Referring to FIG. 11, a recessed region RR2 may be defined in a substrate SUB16. According to an exemplary embodiment, the recessed region RR2 may be formed deeper than the recessed region RR1 of FIG. 10. At least a portion of etched surface (inner side surface) of the recessed region RR2 may be formed to be vertical or relatively vertical. As the depth of the recessed region RR2 deepens, fixing characteristics of an active material element AE16 that is housed or accommodated in the recessed region RR2 may be improved. A large portion of the active material element AE16 may be located in the recessed region RR2. In FIG. 11, EP16 and NL16 refer to an electrode portion and an insulation layer, respectively.

At least two of the exemplary embodiments described with reference to FIGS. 5 to 11 may be used together. In one exemplary embodiment of the secondary battery structure, for example, active material elements (first active material elements) having different sizes and formed of different materials may be applied, but not being limited thereto.

Figure 12:
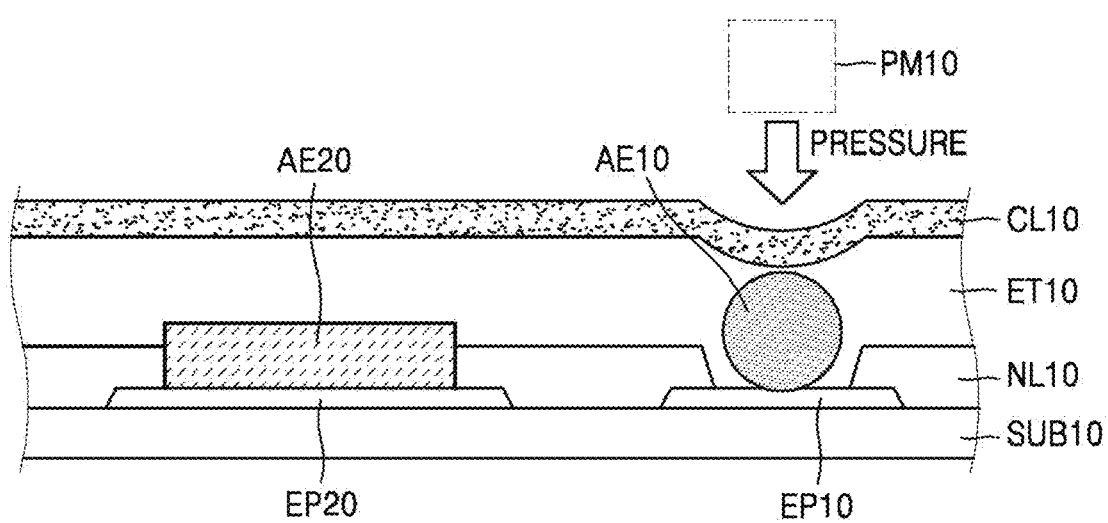
FIG. 12 is a cross-sectional view showing a secondary battery structure according to another exemplary embodiment.

FIG. 12 is a cross-sectional view showing a secondary battery structure according to another exemplary embodiment. The structure of FIG. 12 is a modification of the structure of FIG. 2.

Referring to FIG. 12, an exemplary embodiment of the secondary battery structure may further include a pressing member PM10 for applying pressure to the first active material element AE10. The position of the first active material element AE10 may be fixed by using the pressing member PM10. Accordingly, the pressing member PM10 may function as a fixing member. As such, in such an embodiment, where the pressing member PM10 is further included, a predetermined cover layer CL10 may be disposed over the electrolyte ET10, and then, the pressing member PM10 may be disposed above the cover layer CL10 corresponding to the position of the first active material element AE10. The cover layer CL10 may include or be formed of a polymer material having elasticity, for example, polydimethylsiloxane ("PDMS"). As pressure is applied to a portion of the cover layer CL10 by the pressing member PM10, the first active material element AE10 may be fixed. The pressing member PM10 may press the portion of the cover layer CL10 using external pressure such as air pressure (pneumatic pressure). The pressure may be about 1 kilopascal (kPa) or more, for example, about 1 kPa to about 30 kPa. The portion of the cover layer CL10 corresponding to the position of the first active material element AE10 may protrude (bulge) toward the substrate SUB10 due to the pressure by the pressing member PM10, such that the portion of the cover layer CL10 may be concaved toward the substrate SUB10. In such an embodiment, where the position of the first active material element AE10 is fixed by the pressing member PM10, the welding portion WD10 described with reference to FIG. 2 may be omitted. However, in some embodiments, the welding portion WD10 and the pressing member PM10 may be used together.

In another exemplary embodiment, the first active material element AE10 may be directly pressed by a predetermined physical structure without using air pressure (pneumatic pressure). In such an embodiment, the cover layer CL10 may be omitted. Alternatively, a portion of the electrolyte ET10 or a portion of the cover layer CL10 above the first active material element AE10 may be pressed by the physical structure. The physical structure may include, for example, a pin structure. The pin structure will be described later with reference to FIGS. 15 to 20.

Figure 13:
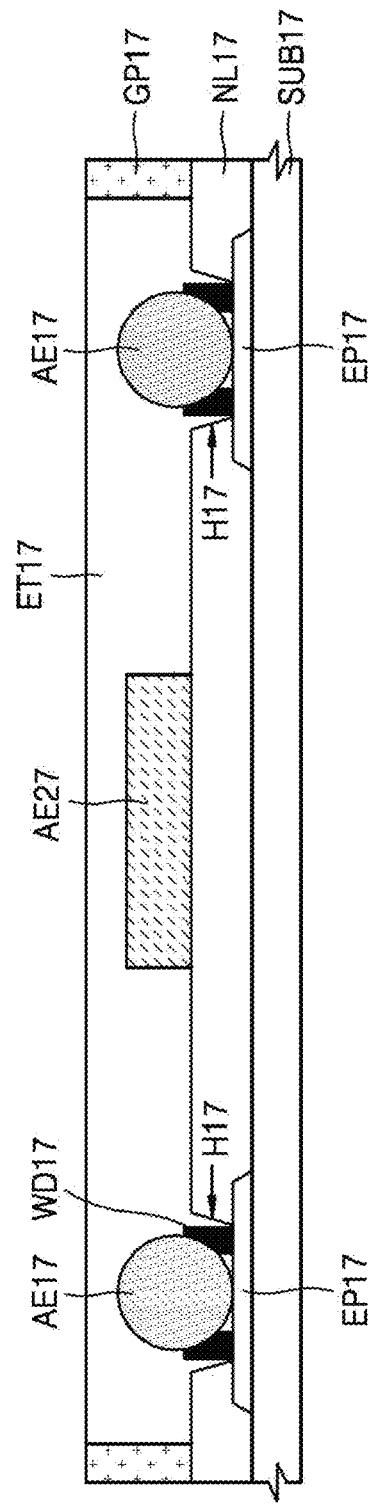
FIG. 13 is a cross-sectional view showing a secondary battery structure according to another exemplary embodiment.

FIG. 13 is a cross-sectional view showing a secondary battery structure according to another exemplary embodiment. FIG. 13, which shows a modification of the structure of FIG. 2, shows a structure of another exemplary embodiment, in which the first active material element and the second active material element are spaced apart in the horizontal direction, that is, a direction perpendicular to the thickness direction of a substrate SUB17.

Referring to FIG. 13, a plurality of first electrode portions EP17 may be disposed on the substrate SUB17. An insulation layer NL17 covering the first electrode portions EP17 may be disposed on the substrate SUB17. An opening H17 that exposes a corresponding one of the first electrode portions EP17 is defined through the insulation layer NL17. The first active material element AE17 contacting the first electrode portions EP17 may be disposed in each opening H17. The first active material element AE17 may have, for example, a particle structure. The second active material element AE27 spaced apart from the first electrode portions EP17 may be disposed on a surface of the insulation layer NL17. The second active material element AE27 may have, for example, a thin film structure. The first active material element AE17 may be a cathode active material, and the second active material element AE27 may be an anode active material, or vice versa. Although not illustrated, a second electrode portion contacting the second active material element AE27 may be further included in the secondary battery structure. The second electrode portion may be a type of current collector. The second electrode portion may be disposed between the insulation layer NL17 and the second active material element AE27, or on the second active material element AE27. In an exemplary embodiment, where the second electrode portion is disposed between the insulation layer NL17 and the second active material element AE27, the second electrode portion may have a thin film structure. In an exemplary embodiment, where the second electrode portion is disposed above the second active material element AE27, the second electrode portion may have a thin film structure or a pin structure. In FIG. 13, WD17, GP17 and ET17 refer to a welding portion, a guide pattern, and an electrolyte, respectively.

Figure 14:
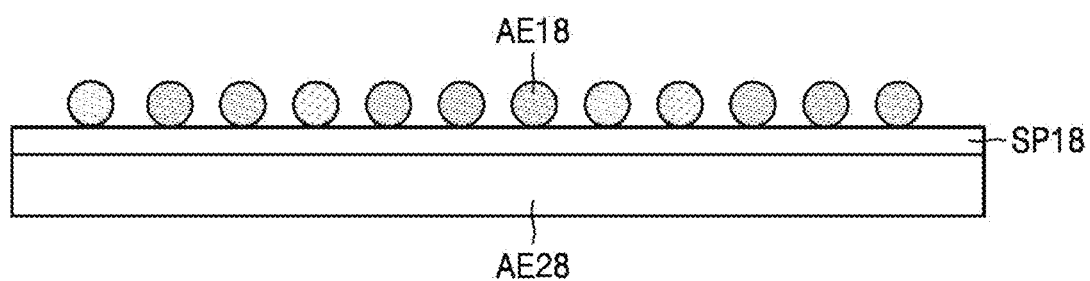
FIG. 14 is a cross-sectional view showing a secondary battery structure according to another exemplary embodiment.

FIG. 14 is a cross-sectional view showing a secondary battery structure according to another exemplary embodiment. According to an exemplary embodiment of a secondary battery structure, as shown in FIG. 14, a first active material element (or a first electrode portion) and a second active material element (or a second electrode portion) are spaced apart in a vertical direction, that is, a thickness direction of a substrate or the secondary battery structure.

Referring to FIG. 14, a plurality of first active material elements AE18 may be arranged facing a second active material element AE28. The second active material element AE28 may be vertically spaced apart from a plane where the first active material elements AE18 are arranged. In such an embodiment, a separator SP28 may be disposed between the first active material elements AE18 and the second active material element AE28. The first active material elements AE18 may be a cathode active material, and the second active material element AE28 may be an anode active material, or vice versa. Although not illustrated, a first electrode portion connected to each of the first active material elements AE18, and a second electrode portion connected to the second active material element AE28, may be further included in the secondary battery structure. The first electrode portion may be a cathode current collector, and the second electrode portion may be an anode current collector, or vice versa. Also, although not illustrated, an electrolyte that allows ions to move between the first active material elements AE18 and the second active material element AE28 may be further included in the secondary battery structure. The separator SP18 may be an element that physically separates the first active material elements AE18 and the second active material element AE28 and allows the movement of electrolyte or the movement of ions through the electrolyte.

Figure 15:
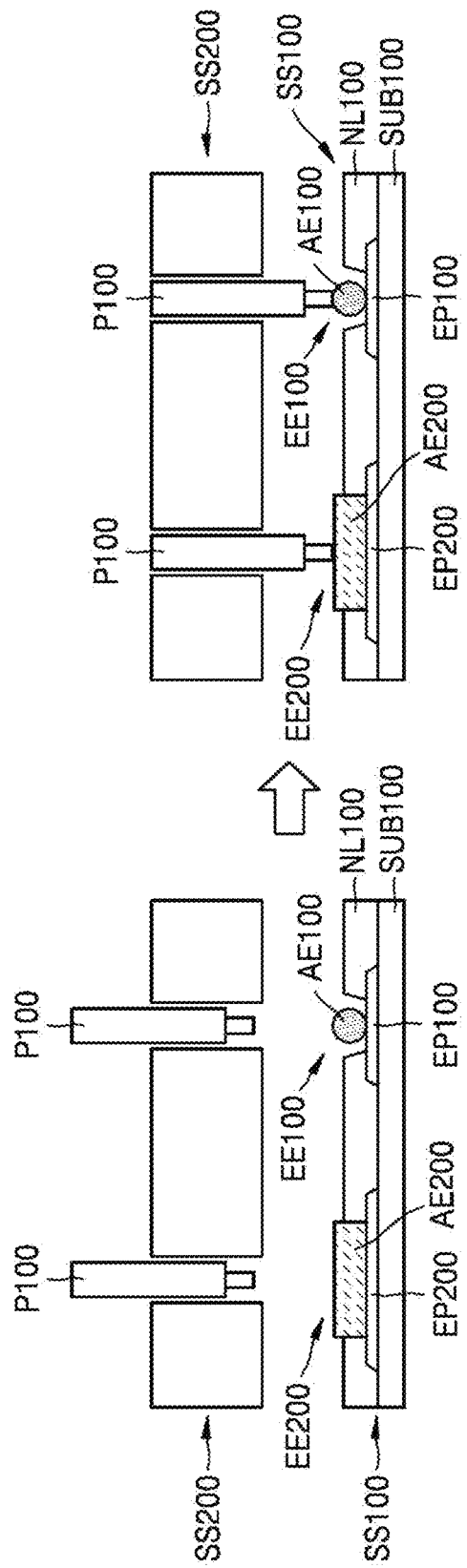
FIG. 15 is a cross-sectional view showing a secondary battery structure according to another exemplary embodiment.

FIG. 15 is a cross-sectional view showing a secondary battery structure according to another exemplary embodiment.

Referring to FIG. 15, an exemplary embodiment of a secondary battery structure may include a first substrate structure SS100 and a second substrate structure SS200 corresponding to or facing each other. The first substrate structure SS100 may have a structure similar to the secondary battery structure described above with reference to FIG. 2. In such an embodiment, the first substrate structure SS100 may include a plurality of first electrode elements EE100 and a second electrode element EE200 which are disposed on a first substrate SUB100, as in the exemplary embodiments described above with reference to FIGS. 1 and 2. For convenience of illustration, FIG. 15 illustrates only one first electrode element EE100 of the plurality of first electrode elements EE100. In such an embodiment, the first electrode element EE100 may include a first electrode portion EP100 and a first active material element AE100, and the second electrode element EE200 may include a second electrode portion EP200 and a second active material element AE200. The second substrate structure SS200 may include a plurality of pin structures P100. The pin structures P100 may correspond to the first electrode elements EE100 and the second electrode element EE200. The pin structures P100 may be electrically connected to the first active material element AE100 and the second active material element AE200 and apply pressure thereto. A spring element (not shown) may be disposed in each of the pin structures P100. The pin structures P100 may press the first active material elements AE100 and the second active material element AE200 with a relatively constant pressure by the spring element. The pin structures P100 may fix the positions of the first active material element AE100. Although not illustrated, an electrolyte contacting the first electrode elements EE100 and the second electrode element EE200 may be disposed between the first substrate structure SS100 and the second substrate structure SS200. In the right-side drawing of FIG. 15, the second substrate structure SS200 including the pin structures P100 may be an element constituting the secondary battery structure (the apparatus), that is, a part of the secondary battery structure. In FIG. 15, NL100 refers to an insulation layer.

Figure 16:
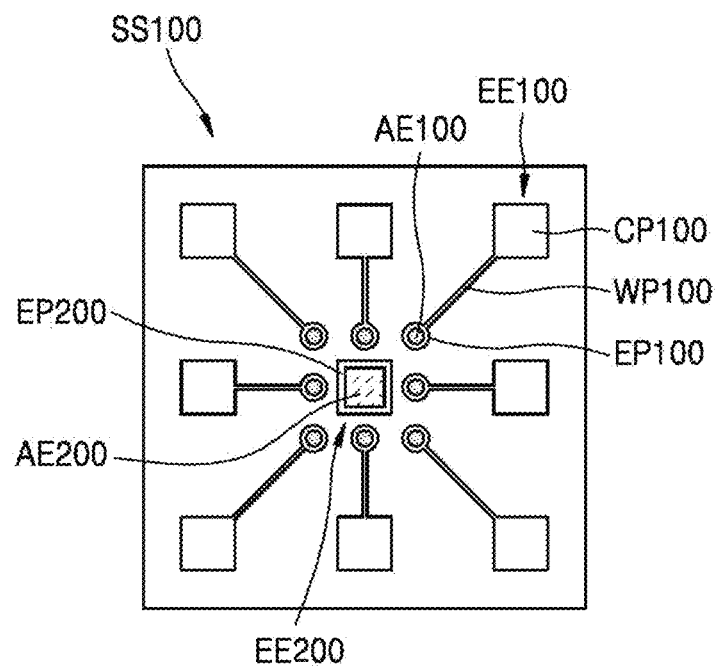
FIGS. 16 and 17 are plan views exemplarily illustrating planar structures of a first substrate structure and a second substrate structure of FIG. 15.
Figure 17:
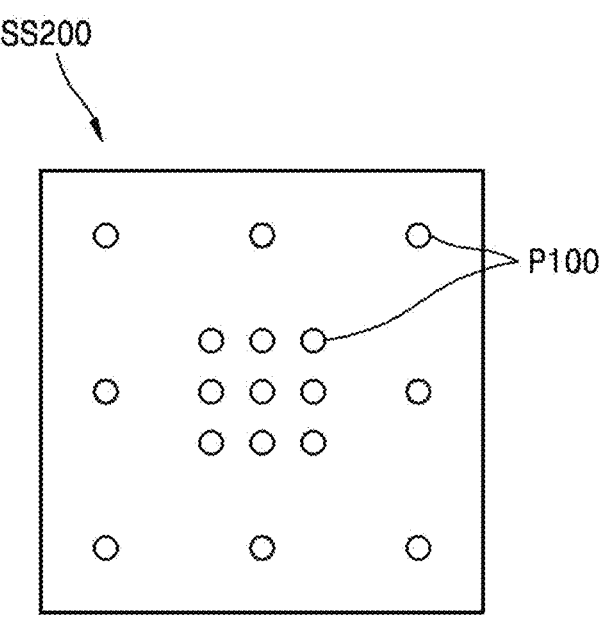

FIGS. 16 and 17 are plan views exemplarily illustrating planar structures of the first substrate structure SS100 and the second substrate structure SS200 of FIG. 15.

Referring to FIG. 16, the first substrate structure SS100 may include the first electrode elements EE100 and a second electrode element EE200. Each of the first electrode elements EE100 may include a first electrode portion EP100, a first contact pad CP100, and a first wiring portion WP100 connecting the first electrode portion EP100 and the first contact pad CP100. The first electrode element EE100 may further include the first active material element AE100 that is disposed on the first electrode portion EP100. The second electrode element EE200 may include the second electrode portion EP200 and the second active material element AE200 disposed on the second electrode portion EP200. The first active material elements AE100 may be disposed around the second active material element AE200. Although not illustrated, a second contact pad that is connected to a second electrode portion EP200 may be further included in the secondary battery structure.

Referring to FIG. 17, the second substrate structure SS200 may include the pin structures P100. Some of the pin structures P100 may be disposed corresponding to the first active material elements AE100 and the second active material element AE200 described above with reference to FIG. 16. In such an embodiment, nine of the pin structures P100 that are arranged at a central portion of the second substrate structure SS200 may correspond to the first active material elements AE100 and the second active material element AE200. The other pin structures P100 may be disposed corresponding to the first contact pads CP100 described with reference to FIG. 16. In such an embodiment, eight of the pin structures P100 arranged at an outer portion of the second substrate structure SS200 may correspond to the first contact pads CP100.

Figure 18:
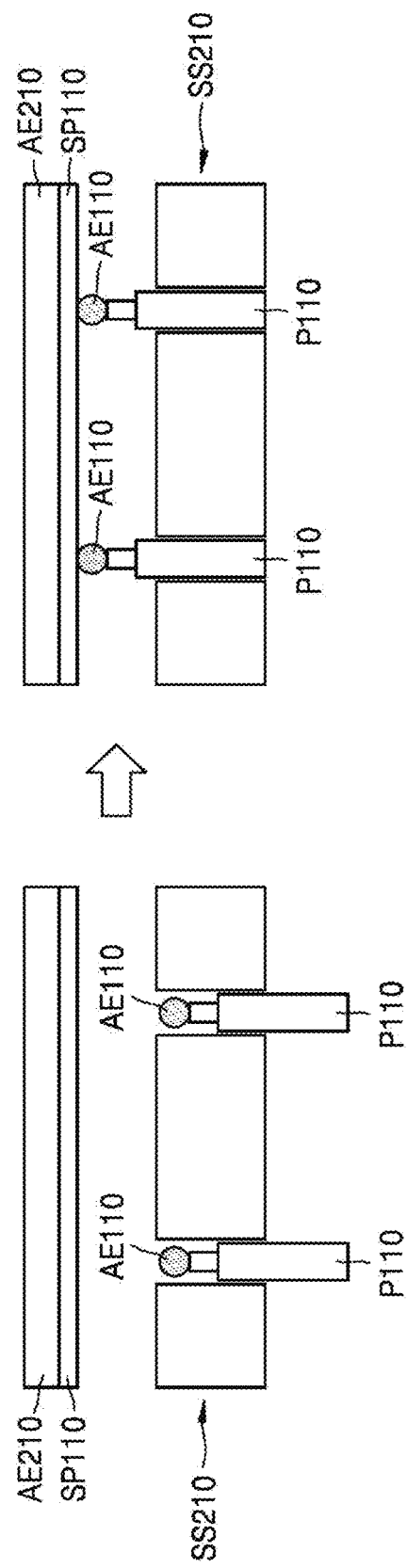
FIG. 18 is a cross-sectional view showing a secondary battery structure according to another exemplary embodiment.

FIG. 18 is a cross-sectional view showing a secondary battery structure according to another exemplary embodiment.

Referring to FIG. 18, in an exemplary embodiment, a secondary battery structure may further include a substrate structure SS210 including a plurality of pin structures P110. The pin structures P110 may be disposed in a plurality of holes of the substrate structure SS210, respectively. A plurality of first active material elements AE110 may be disposed to respectively correspond to the pin structures P110. In such an embodiment, the first active material elements AE110 may be inserted in the holes of the substrate structure SS210. The first active material elements AE110 may function as the first electrode elements described above. A separator SP110 may be arranged above the substrate structure SS210. A second active material element AE210 may be arranged on the separator SP110. The second active material element AE210 may function as the second electrode element described above. As the pin structures P110 of the substrate structure SS210 push the first active material elements AE110 corresponding thereto, the first active material elements AE110 may be in a contact with the separator SP110. As a result, the first active material elements AE110 may be arranged facing the second active material element AE210 with the separator SP110 interposed therebetween. Although not illustrated, the substrate structure SS210 may further include another second pin structure that is electrically connected to or electrically contacts the second active material element AE210. In such an embodiment, the another second pin structure may be connected to or may contact the second active material element AE210 by passing through the separator SP110. The second pin structure may function as the second current collector described above, but not being limited thereto. In an alternative exemplary embodiment, a structure other than the second pin structure may function as the second current collector. In such an embodiment, although not illustrated, an electrolyte for the movement of ions between the first active material elements AE110 and the second active material element AE210 may be further included in the secondary battery structure. In the right-side drawing of FIG. 18, the substrate structure SS210 including the pin structures P110 may be an element constituting the secondary battery structure (the apparatus), that is, a part of the secondary battery structure.

Figure 19:
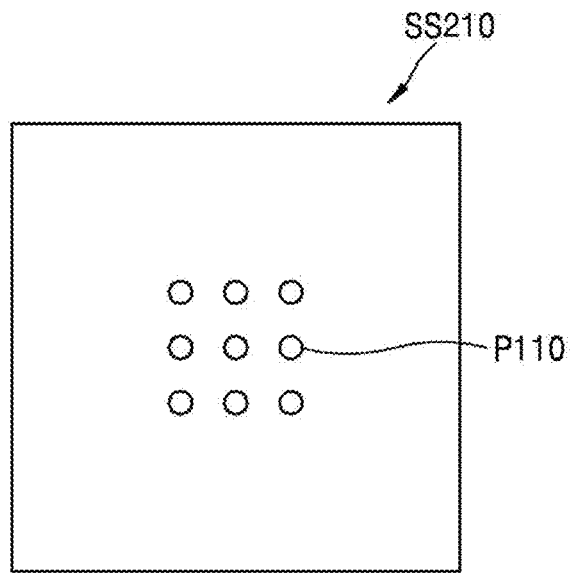
FIG. 19 is a plan view exemplary illustrating a planar structure of the substrate structure of FIG. 18.

FIG. 19 is a plan view exemplary illustrating a planar structure of the substrate structure SS210 of FIG. 18.

Referring to FIG. 19, the substrate structure SS210 may include the pin structures P110 corresponding to the first active material element AE110 of FIG. 18. Although not illustrated, the substrate structure SS210 may further include the second pin structure that is electrically connected to or electrically contacts the second active material element AE210 of FIG. 18. The second pin structure may be disposed, for example, at an outer edge portion of the substrate structure SS210.

Figure 20:
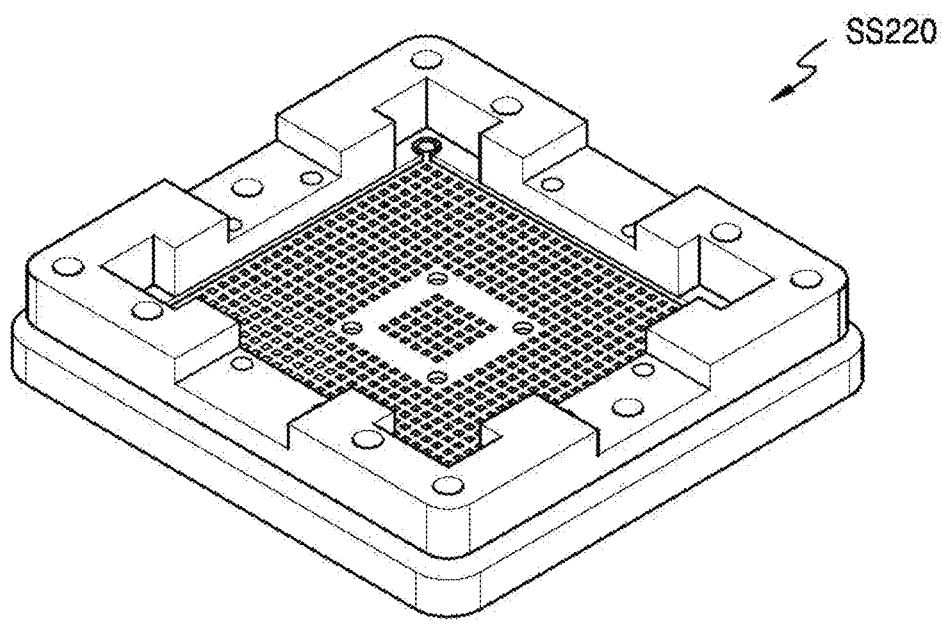
FIG. 20 is a perspective view exemplary illustrating an overall structure of the substrate structure of FIG. 18.

FIG. 20 is a perspective view exemplary illustrating an overall structure of the substrate structure SS210 of FIG. 18. Such a substrate structure SS220 shown in FIG. 20 may be applied not only to the substrate structure SS210 of FIG. 18, but also to the second substrate structure SS200 of FIG. 15.

Referring to FIG. 20, the substrate structure SS220 may include a plurality of fine holes and pin structures (not shown) may be in the holes. A predetermined support structure or guide structure may be disposed at an outer edge portion of the substrate structure SS220. The above-described structure of the substrate structure SS220 of FIG. 20 is merely exemplary and the structure thereof may be modified in various ways.

The sectional structures and two-dimensional ("2D") structures of the secondary battery described with reference to FIGS. 15 to 20 are merely exemplary and may be modified in various ways. In other alternative exemplary embodiment, the array methods, the number of electrodes or pins, or the shape of FIGS. 16, 17, and 19 may be modified in various ways.

Figure 21:
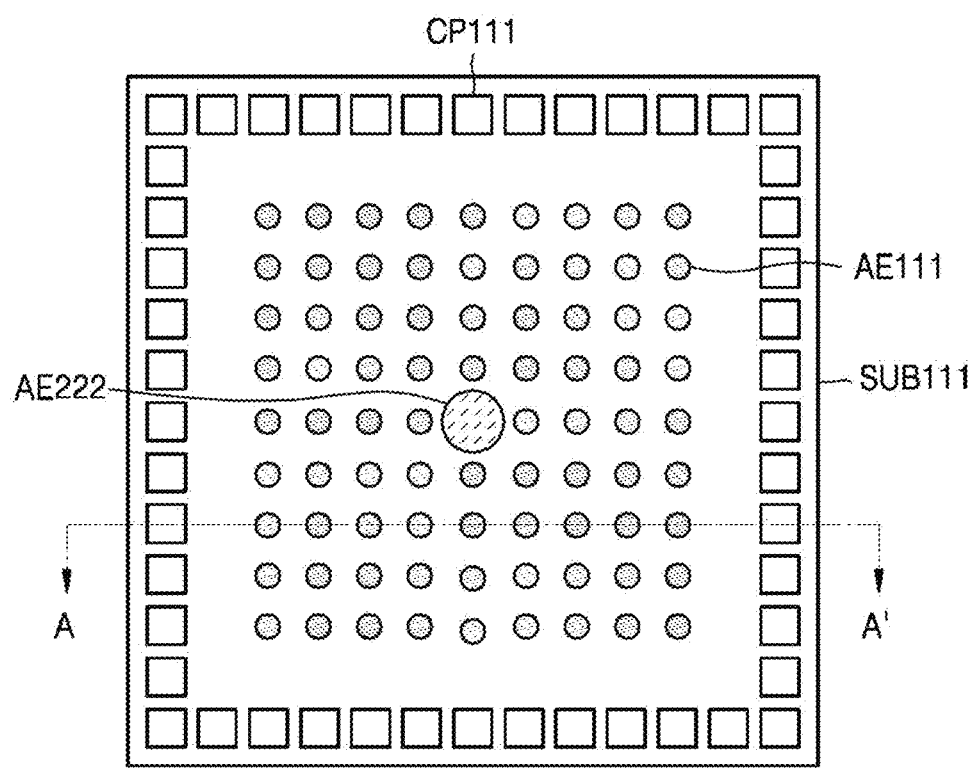
FIG. 21 is a plan view illustrating a secondary battery structure according to another exemplary embodiment.

FIG. 21 is a plan view illustrating a secondary battery structure according to another exemplary embodiment.

Referring to FIG. 21, in an exemplary embodiment, a plurality of first active material elements AE111 may be disposed on a substrate SUB111. In such an embodiment, a second active material element AE222 may be disposed on the substrate SUB111, spaced apart from the first active material elements AE111. The first active material elements AE111 and the second active material element AE222 may collectively constitute a predetermined array structure. The first active material elements AE111 may include or be formed of the same material as each other or two or more different materials. In an exemplary embodiment, the first active material elements AE111 may have substantially the same size as each other, or two or more different sizes. In an exemplary embodiment, each of the first active material elements AE111 may be a single particle, but not being limited thereto. Although not illustrated in FIG. 21, a plurality of first electrode portions may be disposed on the substrate SUB111, and the first active material elements AE111 may be disposed on the respective first electrode portions. In such an embodiment, the second electrode portion may be disposed on the substrate SUB111, and the second active material element AE222 may be disposed on the second electrode portion.

The secondary battery structure may further include a plurality of contact pads CP111 disposed at an outer edge portion of the substrate SUB111. Each of the contact pads CP111 may be connected to one of the first active material elements AE111 and the second active material element AE222. In such an embodiment, a wiring portion (not shown) for connecting each of the contact pads CP111 and the active material elements AE111 and AE222 corresponding thereto may be further included in the secondary battery structure. The array structure of FIG. 21 is merely exemplary, and the array method, number and structure of the active material elements AE111 and AE222 and the contact pads CP111 may be modified in various ways.

Figure 22:
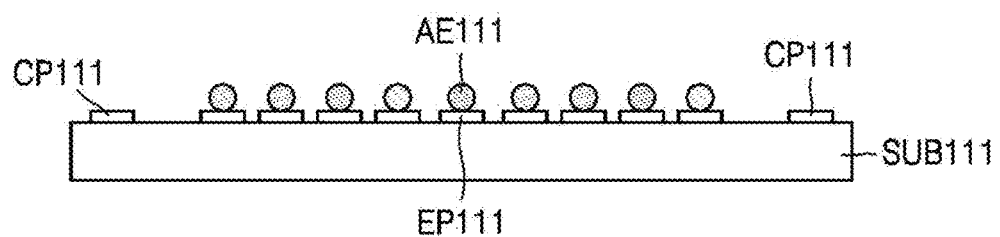
FIG. 22 is a cross-sectional view taken along line A-A' of FIG. 21.

FIG. 22 is a cross-sectional view taken along line A-A' of FIG. 21.

Referring to FIG. 22, a plurality of first electrode portions EP111 may be disposed on the substrate SUB111. The first active material elements AE111 may be respectively disposed on the first electrode portions EP111. The contact pads CP111 may be disposed at the outer edge portion of the substrate SUB111. Although not illustrated, a wiring portion for connecting each of the contact pads CP111 and each of the first active material elements AE111 corresponding thereto may be further included in the secondary battery structure. In an exemplary embodiment, the structure of FIG. 22 may further include elements (not shown) corresponding to the insulation layer NL10 and the electrolyte ET10 which are described with reference to FIG. 2.

In an exemplary embodiment having the structure illustrated in FIGS. 21 and 22, the first active material elements AE111 and the second active material element AE222 may be individually controlled. In such an embodiment, addresses may be assigned to the first active material elements AE111 and the second active material element AE222, and ON/OFF operations may be selectively performed for each address. In such an embodiment, an address may be assigned to each of a plurality of electrodes (array electrodes) corresponding to the first active material elements AE111 and the second active material element AE222, and the electrodes may be selectively operated for each address.

Hereinafter, an exemplary embodiment of a method of performing analysis and evaluation of a secondary battery structure having the structure illustrated in FIGS. 21 and 22 will be described. The analysis and evaluation may be performed for each of the first active material elements AE111. In an exemplary embodiment, where each of the first active material elements AE111 is a single particle, the analysis and evaluation may be performed at a particle level.

Figure 23:
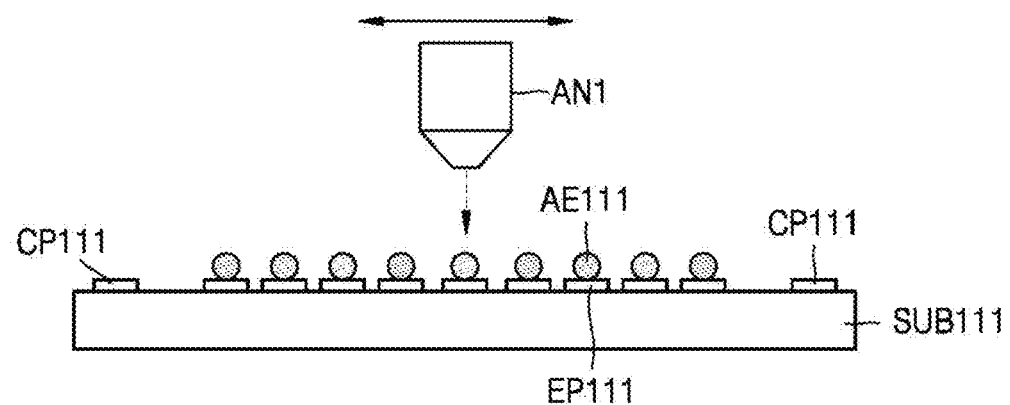
FIG. 23 is a conceptual view illustrating an exemplary embodiment of a method of performing analysis and evaluation with respect to the secondary battery structure of FIG. 22.

FIG. 23 is a conceptual view illustrating an exemplary embodiment of a method of performing analysis and evaluation with respect to the secondary battery structure of FIG. 22. As illustrated in FIG. 23, analysis and evaluation of the first active material elements AE111 may be performed by using a predetermined analysis device AN1. In an exemplary embodiment, where each of the first active material elements AE111 is a single particle, analysis of materials at a particle level may be used. In one exemplary embodiment, for example, Raman analysis, Auger analysis, SEM analysis or X-ray analysis may be used. The material analysis may be performed on each of the first active material elements AE111 to which an address is assigned. In an exemplary embodiment, various pieces of electrochemical data may be obtained for each address that is assigned to each of the first active material elements AE111. In such an embodiment, electrochemical data corresponding to each of the first active material elements AE111 may be obtained. The electrochemical data may be, for example, electric conductivity, open circuit voltage ("OCV") characteristics, or charge/discharge characteristics. Various pieces of electrochemical data (e.g., electric conductivity, OCV characteristics, and charge/discharge characteristics) and material analysis data (e.g., data obtained from Raman analysis, Auger analysis, SEM analysis or X-ray analysis), which are obtained for each address, are gathered and correlation therebetween may be analyzed and evaluated based on various statistical processing methods or analysis methods.

Figure 24:
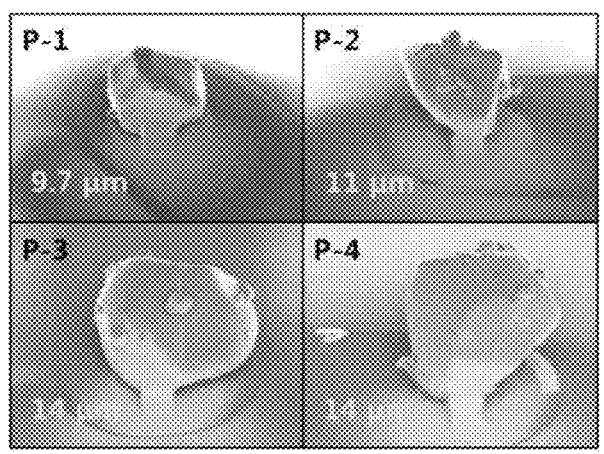
FIG. 24 is a SEM image showing four single particles included in a secondary battery structure according to an exemplary embodiment.
Figure 25:
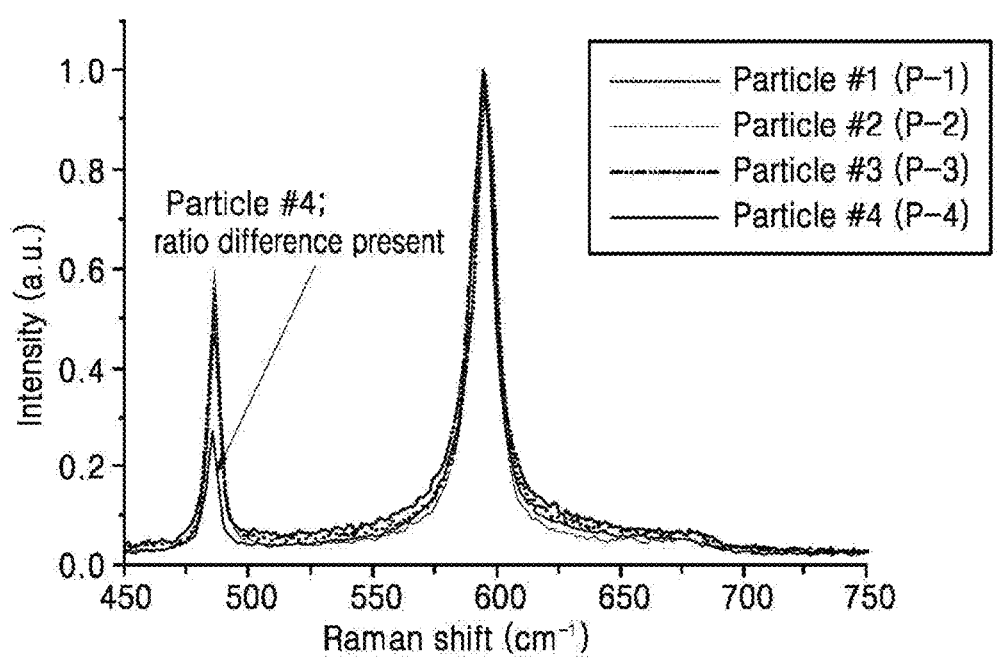
FIG. 25 is a graph showing a result of Raman analysis of the four single particles of FIG. 24.
Figure 26:
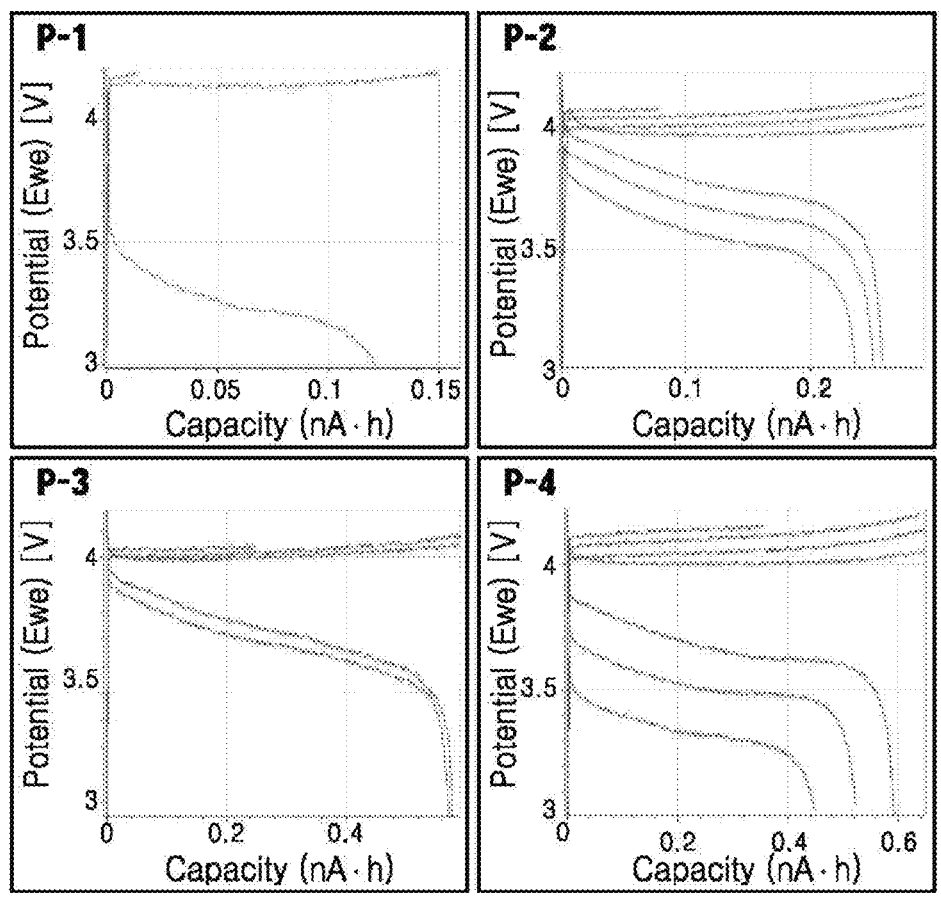
FIG. 26 is a graph showing a result of evaluation of charge and discharge characteristics with respect to the four single particles of FIG. 24.

FIG. 24 is a SEM image showing four single particles P-1, P-2, P-3 and P-4 included in a secondary battery structure according to an exemplary embodiment. FIG. 25 is a graph showing a result of Raman analysis of the four single particles P-1, P-2, P-3 and P-4. FIG. 26 is a graph showing a result of evaluation of charge and discharge characteristics with respect to the four single particles P-1, P-2, P-3 and P-4 of FIG. 24. The four single particles P-1, P-2, P-3 and P-4 are $LiCoO_2$ particles and are used as a cathode active material of a secondary battery.

The size or shape of each particle may be seen from the SEM image of FIG. 24, and a theoretical charge capacity may be expected from the information. Crystal characteristics and interatomic bonding characteristics of each particle may be seen from a result of Raman analysis of FIG. 25, for example. Charge/discharge characteristics of each particle may be seen from a result of FIG. 26. Correlation between the size of a particle, the material characteristics, and the charge/discharge characteristics may be obtained by comparing and analyzing the results of FIGS. 24 to 26. In an exemplary embodiment, since various analysis methods may be independently performed with respect to several active material elements (e.g., single particles) in a secondary battery structure, efficiency of analysis and evaluation may be substantially improved. Various analysis methods may be performed with respect to any one of active material elements (e.g., single particle), and the analysis results may be compared and evaluated. Various pieces of data may be obtained for each of active material elements. Accordingly, correlation between the material characteristics and the electrochemical characteristics may be efficiently and effectively obtained.

Figure 27:
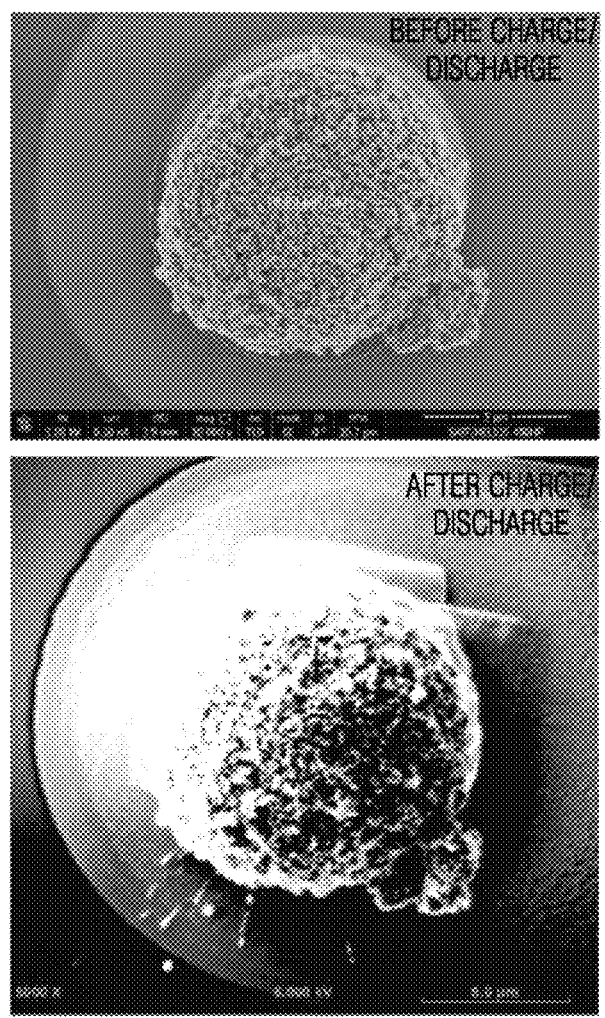
FIG. 27 is a SEM image showing a single particle included in a secondary battery structure, in states before/after charge and discharge, according to an exemplary embodiment.
Figure 28:
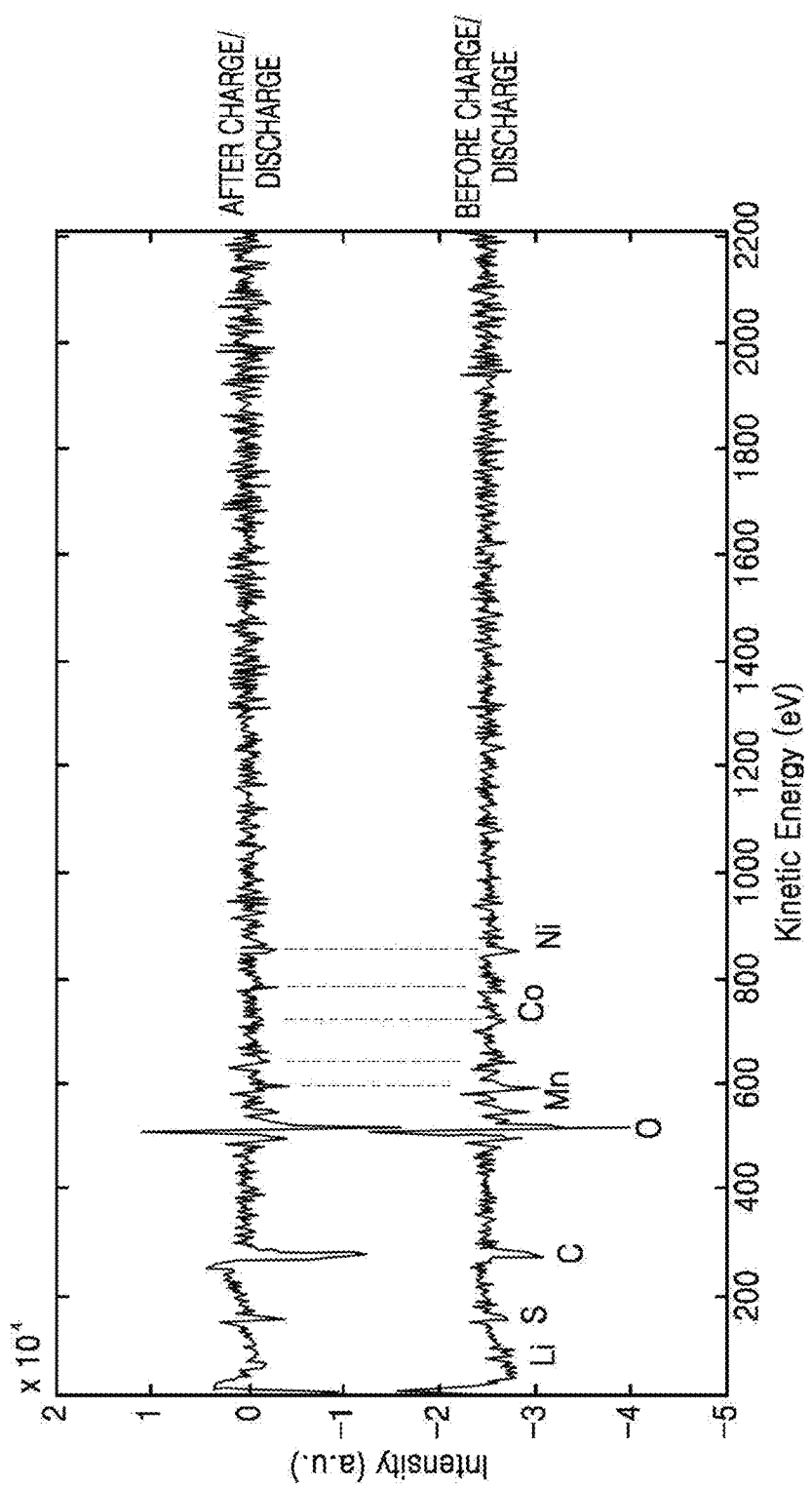
FIG. 28 is a graph showing a result of Auger analysis with respect to the single particle of FIG. 27 before charge/discharge and after charge/discharge.

FIG. 27 is a SEM image showing a single particle included in a secondary battery structure, in states before/after charge and discharge, according to an exemplary embodiment. FIG. 28 is a graph showing a result of Auger analysis with respect to the single particle of FIG. 27 before charge/discharge and after charge/discharge. The single particle is an OLO particle including $LiCoO_2$, Ni, Co and Mn, and may be used as a cathode active material of a secondary battery. The states before charge/discharge and after charge/discharge may be states before and after deterioration.

A change in the state of a particle and a change in the microstructure or shape of a particle according to a charge/discharge operation may be seen from a result of the SEM analysis of FIG. 27. A change in the composition of a particle, in particular, a change in the metal component such as Mn, Co and Ni, according to the charge/discharge operation may be seen from a result of the Auger analysis of FIG. 28. The Auger analysis may be effectively used for an analysis of, e.g., the component and composition of a surface of a material. A degree of deterioration and a change in the characteristics of an active material element (e.g., a single particle) according to the charge/discharge operation may be analyzed by using information shown in FIGS. 27 and 28. Furthermore, a change in the work function and energy bandgap of an active material element according to the charge/discharge operation may be analyzed.

Figure 29:
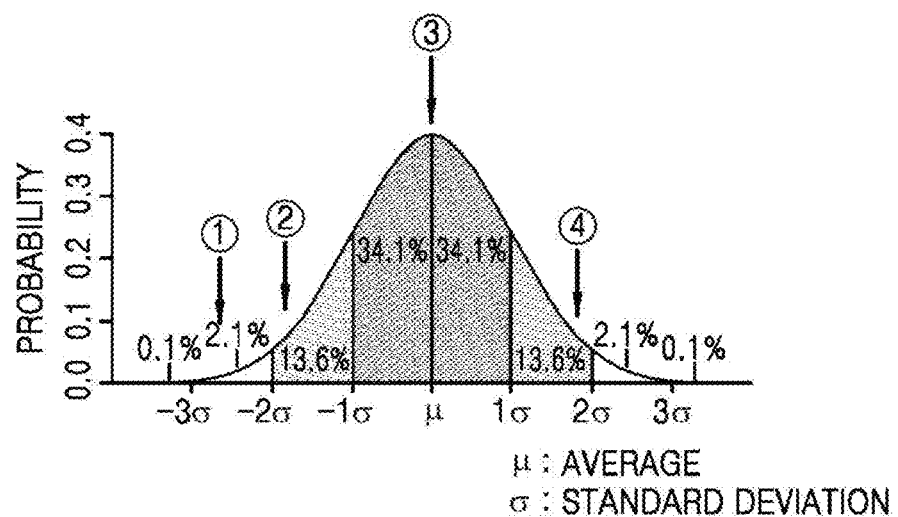
FIGS. 29 and 30 are graphs exemplarily illustrating resultant data obtained by an analysis and evaluation method according to an exemplary embodiment.
Figure 30:
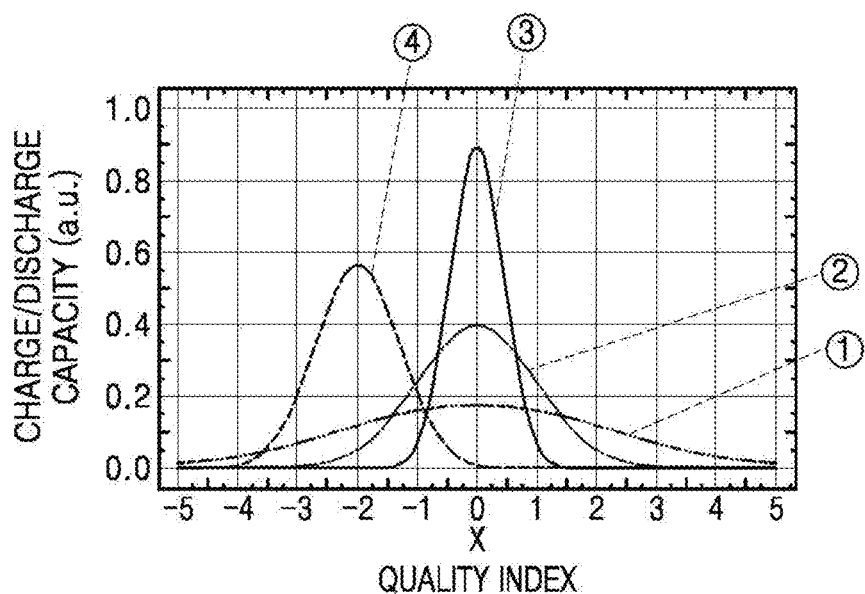

FIGS. 29 and 30 are graphs exemplarily illustrating resultant (intermediate) data obtained by the analysis and evaluation method according to the exemplary embodiment described with reference to FIG. 23. FIG. 29 is a distribution graph of predetermined quality (property) of the active material elements AE111. FIG. 30 is a graph exemplarily showing correlation between the quality (property) of a material and a charge/discharge capacity.

Referring to FIG. 29, a distribution graph of predetermined quality of the active material elements AE111 may be obtained by using an exemplary embodiment of a method described above with reference to FIG. 23. In such an embodiment, individual analysis may be performed with respect to particular quality of the active material elements AE111 and then a result thereof may be gathered, thereby obtaining the distribution graph of FIG. 29. Since an address exists for each of the active material elements AE111, information about the quality and position of each of the active material elements AE111 may be obtained. In such an embodiment, the active material elements AE111 having similar quality may be classified into a plurality of groups and the electrochemical characteristics of each group may be checked. In one exemplary embodiment, for example, the charge/discharge characteristics of the active material elements (active material element groups) corresponding to four regions, that is, regions ①, ②, ③ and ④, indicated in FIG. 29 may be checked. As a result, data as shown in FIG. 30 may be obtained.

FIG. 30 is a graph exemplarily showing the charge/discharge characteristics of the active material elements (active material element groups) corresponding to four regions, that is, regions ①, ②, ③ and ④, indicated in FIG. 29. In FIG. 30, correlation between the charge/discharge capacity and the particular quality of a material may be easily checked. As shown in FIG. 30, the active material elements corresponding to the region ③ exhibit higher charge/discharge characteristics. As such, according to an exemplary embodiment, it may be effectively checked electrochemical characteristics, for example, charge/discharge characteristics, of an active material element having particular quality, such as particle size, material composition, or crystal structure, in a secondary battery. The results of FIGS. 29 and 30 are merely exemplary, and the analysis and evaluation method may be modified in various ways.

Figure 31:
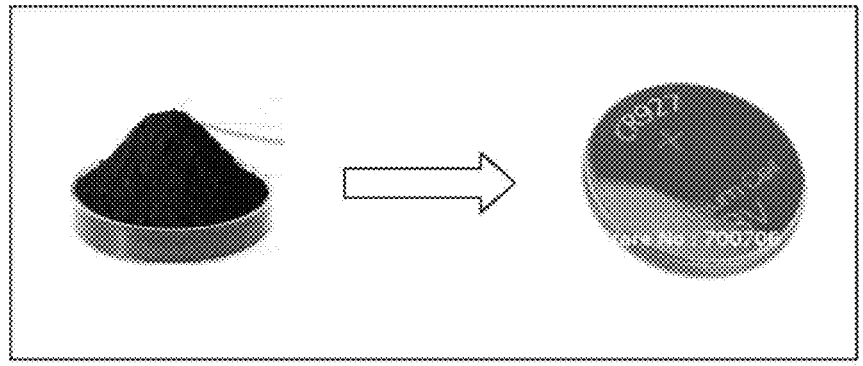
FIG. 31 is a view showing a secondary battery according to a comparative example, and an analysis method thereof.

FIG. 31 is a view showing a conventional secondary battery according to a comparative example, and an analysis method thereof. As illustrated in FIG. 31, the conventional secondary battery according to a comparative example is manufactured by inserting a large amount of active material powder into a coin cell, and analysis with respect to the coil cell is performed. In such a conventional secondary battery, performance of the secondary battery is evaluated based on an average physical properties value, for example, an average diameter or an average composition, of active material powder, and it may be difficult to extract correlation between a quality distribution of a material (active material) and battery performance. In such a conventional secondary battery, it may be very difficult to precisely and accurately analyze correlation between the particular quality of a material (active material) and the particular performance of a battery. Also, since manufacturing costs of a coin cell are relatively high, when the coin cell is in use, it may not be desired in terms of costs of analysis and evaluation, and research and development.

However, according to exemplary embodiments, since various analyses such as electrochemical analysis and material analysis are performed with respect to each of a plurality of active material elements, for example, a plurality of single particles, and the obtained data are gathered and statistically processed, correlation between various characteristics of a material and battery performance may be precisely and accurately extracted. Based on such correlation between various characteristics, a detailed reason for a particular defect in the development of a secondary battery may be easily identified. In one exemplary embodiment, for example, the material analysis and the evaluation of electrochemical characteristics (battery characteristics) may be in-situ performed by using a single chip structure (secondary battery structure). In such embodiments, since a plurality of active material elements having different materials, physical properties, and sizes may be provided in a single chip structure (secondary battery structure) and analysis and evaluation may be performed with respect to the active material elements, analysis with respect to various active materials may be simultaneously or easily performed. Such embodiments may be used for analysis and evaluation of not only an active material but also an electrolyte combined with an active material, an electrode, or an adhesive layer. Accordingly, analysis and evaluation technologies about various materials such as an active material, an electrolyte, an electrode, or an adhesive layer of a secondary battery may be substantially improved. In such an embodiment, high-throughput analysis may be possible, and a lead-time for development and production of a secondary battery may be substantially reduced.

Additionally, in such an embodiment of a secondary battery structure, for example, when the number of the first active material elements AE111 in the structure of FIG. 21 is increased, reliability in the analysis and evaluation of an active material may be increased. In such an embodiment, the numbers of the first active material elements AE111 and microelectrodes corresponding thereto may be tens or more or about 100 or more. When the size of a population is one million or more, the size of a sample group to find a sample group having a significant difference in the population may be about 300 to about 1000. In this case, for an evaluation within an error range of about 5% and a reliability of about 95%, about three hundreds and eighty (380) active material elements and microelectrodes corresponding thereto may be used. However, the number of the first active material elements AE111 is not necessarily limited to the tens or more, and the number may be appropriately selected according to the use of a secondary battery structure.

When such an embodiment of the secondary battery structure is used as a power source (battery) of an actual electronic apparatus, not for the material analysis and evaluation operation, that is, a research and development operation, a selective ON/OFF operation with respect to each electrode may be performed, and thus stability of a battery may be improved and lifetime of a battery may be extended. In such an embodiment, when the output voltages of the electrodes connected to the active material elements are periodically monitored and an abnormal electrode is detected, the electric connection of the abnormal electrode is selectively blocked and thus possible problems such as heating, combustion, life shortening due to the abnormal electrode or an abnormal active material element connected thereto may be prevented. Accordingly, in an exemplary embodiment, stability and durability of a battery may be substantially improved. In a conventional battery, damage generated in a local area may cause damage to an entire cell and further to an entire battery pack. In such a conventional battery, incidence of damage in a fine area (local area) in a cell may not be recognized or controlled until damage to the entire cell is generated. According to an exemplary embodiment, any malfunction may be checked for each microelectrode in a single battery cell and a problem generated in a local area may be effectively prevented or removed before the problem affects the entire cell. As a result, problems such as abnormal heating, thermal runaway, explosion, or combustion are prevented and thus stability and durability may be substantially improved. In a wearable/flexible/mobile battery, where stability along with miniaturization/thinning issues are of consideration, such an embodiment of the secondary battery structure may be effectively used as a wearable/flexible/mobile battery.

Figure 32:
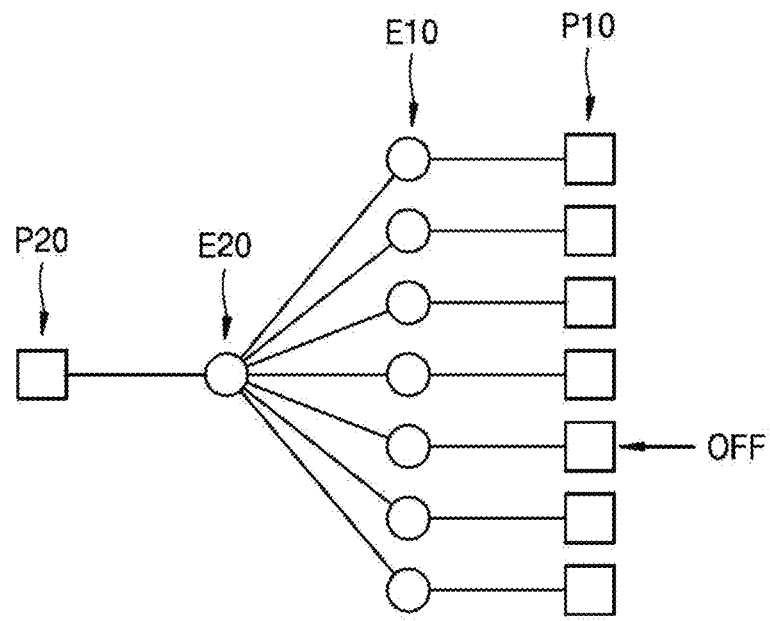
FIG. 32 is a conceptual view showing a selective ON/OFF operation with respect to a plurality of electrodes of a secondary battery structure according to an exemplary embodiment.

FIG. 32 is a conceptual view showing a selective ON/OFF operation with respect to the electrodes of a secondary battery structure according to an exemplary embodiment.

Referring to FIG. 32, an exemplary embodiment of the secondary battery structure may further include a plurality of first electrode elements E10 and a second electrode element E20. In one exemplary embodiment, for example, the secondary battery structure may include a single second electrode element E20. The first electrode elements E10 may be electrochemically and parallelly connected to the second electrode element E20. The first electrode elements E10 may include first active material elements, and the second electrode element E20 may include a second active material element. The first active material elements may be cathode active materials and the second active material element may be an anode active material, or vice versa. In such an embodiment, the secondary battery structure may further include a first pad portion P10 connected to each of the first electrode elements E10 and a second pad portion P20 connected to the second electrode element E20. In such an embodiment, when an abnormal signal is detected from one of the first electrode elements E10, the abnormal signal may be selectively turned off. The other first electrode elements E10, except for the first electrode element E10 that is turned off, are normally operated to contribute to a charge/discharge operation. The number of the first electrode elements E10 that are to be turned off may be increased to be two or more.

Figure 33:
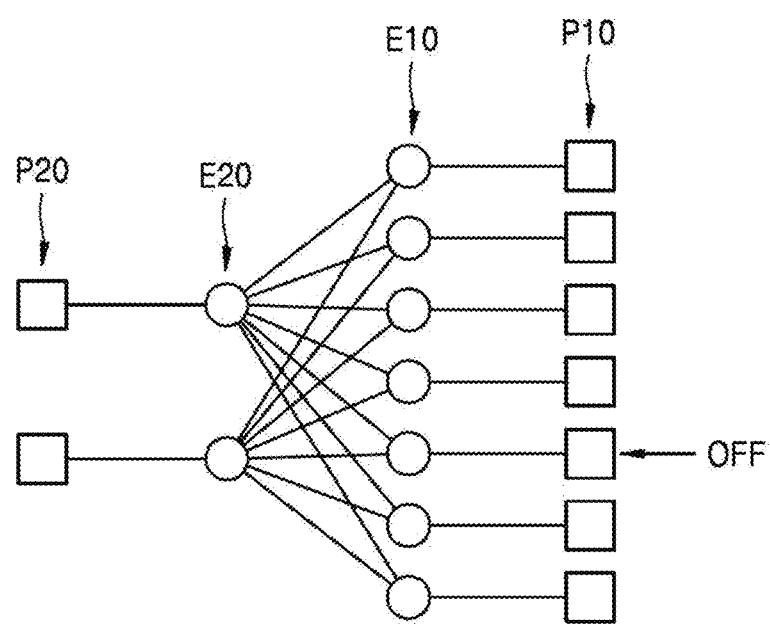
FIG. 33 is a conceptual view showing a selective ON/OFF operation with respect to a plurality of electrodes of a secondary battery structure according to another exemplary embodiment.

Although FIG. 32 illustrates an embodiment including a single second electrode element E20, but alternatively, two or more second electrode elements E20 may be used as shown in FIG. 33. Referring to FIG. 33, an alternative exemplary embodiment of the secondary battery structure may further include a plurality of second electrode elements E20, and the second pad portion P20 may be connected to each of the second electrode elements E20. The first electrode elements E10 may be electrochemically and parallelly connected to each of the second electrode elements E20. One of the first electrode elements E10 may be selectively turned off, or one of the second electrode elements E20 may be selectively turned off. The numbers of the first electrode elements E10 and the second electrode elements E20 illustrated in FIGS. 32 and 33 are merely exemplary, and may be changed in various ways. In some embodiments, the number of the first electrode elements E10 and the number of the second electrode elements E20 may be the same as each other.

Each of the secondary battery structure of FIG. 32 and the secondary battery structure of FIG. 33 may be a cell structure, that is, a single cell structure, and a plurality of the single cell structures may be used by being electrically connected to one another.

In an exemplary embodiment, when a drive circuit similar to a display panel disposed on one electrode portion (electrode layer) is defined to be one pixel, current and voltage may be detected for each pixel (electrode) and individual control thereof may be possible. In such an embodiment, a circuit having a function of blocking electric connection of an abnormal electrode by periodically monitoring an output voltage of each electrode (pixel) may be disposed inside or outside a battery. In other words, an apparatus capable of controlling ON/OFF of each electrode (pixel) may be introduced. In such embodiments, fundamental technologies to manufacture a secondary battery that is typically a passive device may be provided as an active device.

The above-described secondary battery structure according to an exemplary embodiment may be manufactured as a small/ultra-small battery. In one exemplary embodiment, for example, a thin film secondary battery may be manufactured in a method of forming a plurality of particles on an electrode array (e.g., MEA). In such an embodiment, the secondary battery structure may be a microbattery or a nanobattery. Accordingly, the secondary battery structure according to an exemplary embodiment may be easily used as a power source for ultra-small precision mechanical parts, fine devices such as microelectromechanical system ("MEMS"), smart cards, or memory devices. A MEMS-based device may include devices in various fields such as micro air vehicles ("MAV") or automated medication systems. Also, the secondary battery structure according to an exemplary embodiment may be applied to system-on-chip ("SOC") technology.

In an exemplary embodiment, the secondary battery may have a 2D array structure as illustrated in FIGS. 1 and 2, but not being limited thereto. In an alternative exemplary embodiment, the secondary battery may have a three-dimensional ("3D") stacked (layered) structure. In one exemplary embodiment, for example, as illustrated in FIG. 14, the secondary battery may have a stacked (layered) structure in which the first active material elements AE18 and the second active material element AE28 are vertically spaced apart from each other. The 3D stacked structure may include the 2D array structure stacked in a thin thickness. Charge capacity of a secondary batter may be easily increased by increasing the number of active material elements in the 2D array structure or the number of stacks in the 3D stacked structure.

FIGS. 34A to 34E are cross-sectional views illustrating a method of manufacturing a secondary battery structure according to an exemplary embodiment. The exemplary embodiment exemplarily illustrates a method of manufacturing the structure of FIG. 2.

Figure 34A:
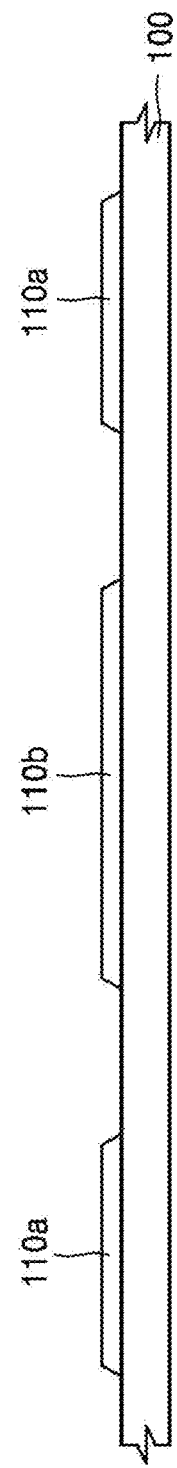

Referring to FIG. 34A, in an exemplary embodiment, a plurality of electrode portions 110a and 110b may be provided or formed on a substrate 100. The substrate 100 may be a semiconductor substrate, for example, a silicon substrate. In an exemplary embodiment, after forming an insulation layer (not shown) such as a silicon oxide layer on the substrate 100, the electrode portions 110a and 110b may be provided or formed on the insulation layer. A variety of materials may be used for the substrate 100 and, when the insulation layer is in use, a variety of materials may be used for the insulation layer.

The electrode portions 110a and 110b may constitute a MEA. The electrode portions 110a and 110b may be formed by a photolithography process or other methods, for example, a lift-off method or an electron beam lithography process. The electrode portions 110a and 110b may include at least one material selected from platinum (Pt), gold (Au), copper (Cu), palladium (Pd), nickel (Ni), titanium (Ti), chromium (Cr), iron (Fe), cobalt (Co), aluminum (Al) and carbon (C). In one exemplary embodiment, for example, the electrode portions 110a and 110b may include a material including carbon (C), e.g., graphene or graphite. The electrode portions 110a and 110b may have a single layer structure or a multilayer structure having two or more layers. In one exemplary embodiment, for example, the electrode portions 110a and 110b may have a double-layer structure in which a Ti layer and a Pt layer are sequentially provided or formed. The Ti layer may be a metal used to enhance an adhesive force with respect to the substrate 100, and the Pt layer may be a metal contacting active material elements 140a and 140b of FIG. 34D which are respectively on the electrode portions 110a and 110b. The above-described double-layer structure (Ti/Pt structure) is merely exemplary and the structures of the electrode portions 110a and 110b may be modified in various ways. The electrode portions 110a and 110b may have a thickness in a range of, for example, about 10 nm to about 1000 nm.

The electrode portions 110a and 110b may include a plurality of first electrode portions 110a and a second electrode portion 110b spaced apart from the first electrode portions 110a. The first electrode portions 110a and the second electrode portion 110b may include or be formed of the same material as each other and have the same structure as each other. However, in an alternative exemplary embodiment, the first electrode portions 110a and the second electrode portion 110b may include or be formed of different materials from each other and have different structures from each other. The first electrode portions 110a may be cathode current collectors and the second electrode portion 110b may be an anode current collector, or vice versa.

Referring to FIG. 34B, an insulation layer 120 covering the electrode portions 110a and 110b may be provided or formed on the substrate 100. In such an embodiment, a plurality of openings H1 and H2 may be defined or formed through the insulation layer 120. The openings H1 and H2 may include a first opening H1 that exposes a portion of each of the first electrode portions 110a, and a second opening H2 that exposes a portion of the second electrode portion 110b. The diameter of each of the first and second the openings H1 and H2 may be in a range of several micrometers to several hundred micrometers, for example, in a range of about 10 μm to about 100 μm. The insulation layer 120 may include at least one of various insulation materials including, for example, silicon oxide ($SiO_2$), silicon nitride (SiNx), aluminum oxide ($Al_2O_3$), and an insulation polymer material. The insulation layer 120 may function as a passivation layer or a protective layer.

Figure 34C:
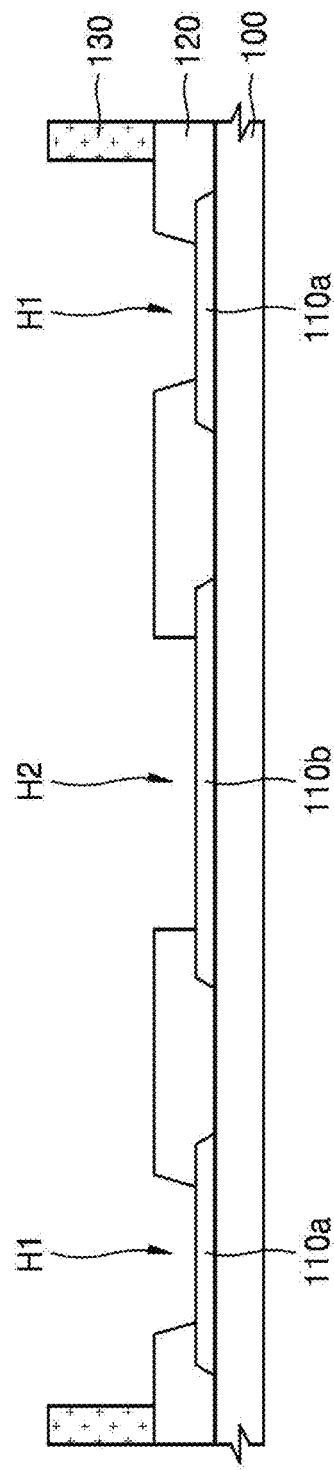

Referring to FIG. 34C, a predetermined guide pattern 130 may be provided or formed on the insulation layer 120. The guide pattern 130 may be provided or formed on the insulation layer 120 at an edge portion of the substrate 100. The guide pattern 130 may include at least one insulation material selected from, for example, silicon oxide ($SiO_2$), silicon nitride (SiNx), aluminum oxide ($Al_2O_3$) and an insulation polymer material. A formation time of the guide pattern 130 may vary and, in some embodiments, the guide pattern 130 may be omitted.

Figure 34D:
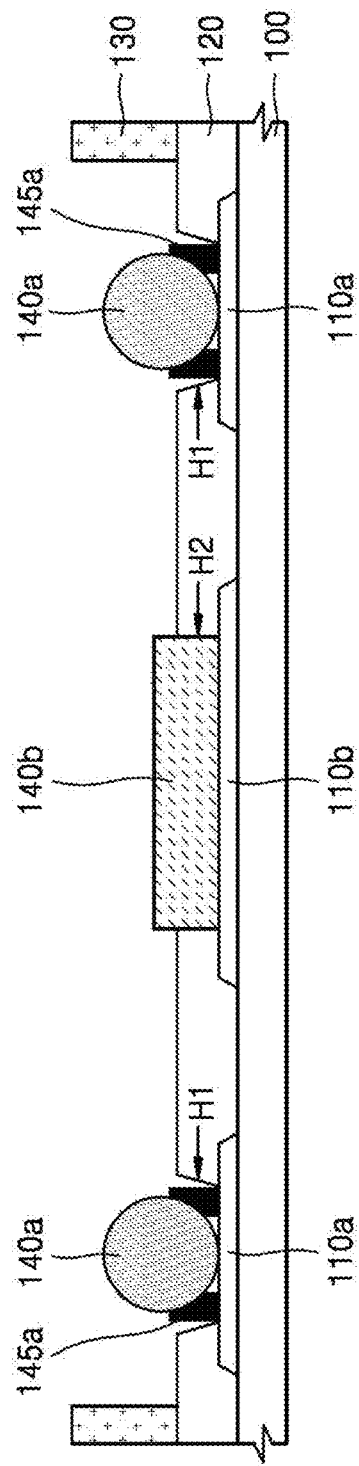

Referring to FIG. 34D, the first active material elements 140a that are electrically connected to or contact the first electrode portion 110a may be provided or formed, and the second active material element 140b that is electrically connected to or contacts the second electrode portion 110b may be provided or formed. The first active material elements 140a may be disposed in the first opening H1, and the second active material element 140b may be disposed in the second opening H2. The first active material elements 140a are first provided or formed and then the second active material element 140b is provided or formed, or vice versa.

The first active material elements 140a each may have, for example, a particle structure. In an exemplary embodiment, each of the first active material elements 140a may be a single particle. The diameter of a particle may be in a range from about 1 μm to about 100 μm, for example, about 5 μm to about 30 μm. However, in some embodiments, the diameter of the particle may be less than about 1 μm. In an exemplary embodiment where the secondary battery structure manufactured is a lithium secondary battery and the first active material elements 140a are cathode active materials, the first active material elements 140a may include, for example, a lithium (Li) metal oxide. The Li metal oxide may include, for example, $Li_2MnO_3$, $Li_2CoO_3$, $LiCoO_2$, $LiFePO_4$, or OLO. Any material that may be used as a cathode active material in a secondary battery may be used for the first active material elements 140a. The first active material elements 140a may directly contact surfaces of the first electrode portions 110a. In an exemplary embodiment where the first active material elements 140a have a particle structure, the first active material elements 140a may be located on the first electrode portions 110a using a predetermined particle transfer process. In one exemplary embodiment, for example, the particle transfer process may be performed using a microsampling tool including a probe, a microscope, and a positioning stage, for example, an X-Y stage. After attaching a particle on a tip of the probe, the probe may be moved toward the first electrode portions 110a. A material of the probe may be tungsten (W), and the particle may be attached on the tip of the probe by the van der Waals force. When two probes are in use, the particle transfer process may be more easily performed. The particle transferred to the first electrode portions 110a may be firmly fixed on the surfaces of the first electrode portions 110a unless there is an external strong shock. The above-described particle transfer process is merely exemplary, and the method of forming (transferring) the first active material elements 140a may be modified in various ways.

In an exemplary embodiment, the secondary battery structure may further include a fixing member or a binding member to fix or bind the first active material elements 140a to the first electrode portions 110a. In one exemplary embodiment, for example, the fixing member or a binding member may include a welding portion 145a for binding the first active material elements 140a to the first electrode portions 110a corresponding to the first active material elements 140a. The welding portion 145a may include or be formed of a predetermined metal by using, for example, focused ion beam ("FIB") equipment. The welding portion 145a may be formed by performing a metal sputtering process between the first active material elements 140a and the first electrode portions 110a using the FIB equipment. The welding portion 145a may include a metal including, for example, Pt, Au, Cu, Pd, Ni, Ti, Cr, Fe, Co, Al, or a combination, e.g., an alloy, thereof. However, the use of the welding portion 145a is optional and the structure of a fixing member or a binding member may be modified in various ways. In one alternative exemplary embodiment, for example, a predetermined conductive adhesive layer may be provided or formed between the first electrode portions 110a and the first active material elements 140a, without using the welding portion 145a. In such an embodiment, the structure of FIG. 9 may be obtained. Alternatively, after forming a recessed region by etching a part of the substrate 100 and then forming the first electrode portions 110a on the recessed region, the first active material elements 140a may be provided or formed on the first electrode portions 110a in the recessed region. In such an embodiment, the structures of FIGS. 10 and 11 may be obtained. Alternatively, a predetermined pressure may be applied to the first active material elements 140a by using a predetermined pin structure, or a predetermined pressure may be applied to the first active material elements 140a by using a pressing member other than the pin structure. In such an embodiment, the structure of FIG. 12, 15 or 18 may be obtained. In FIG. 12, 15 or 18, the pressing member PM10, the second substrate structure SS200 or the substrate structure SS210 may be considered as an element constituting the secondary battery structure, that is, a part of the secondary battery structure.

However, in some cases, the pressing member PM10 of FIG. 12 may be considered as a manufacturing tool for fabricating the secondary battery structure. Alternatively, the first active material elements 140a may be fixed on the first electrode portions 110a using a predetermined heating process. The heating process may be performed at a temperature of, for example, about 150° C. The temperature of the heating process may be between about 150° C. and about 800° C. Heat may be generated using a method of externally applying heat to the first active material elements 140a and the first electrode portions 110a, or a method of applying over current between the first active material elements 140a and the first electrode portions 110a. As portions of the first active material elements 140a and/or the first electrode portions 110a are melt through the heating process, a physical binding force therebetween may be improved. In an exemplary embodiment, various other methods of fixing the first active material elements 140a to the first electrode portions 110a may be used.

The second active material element 140b may have, for example, a thin film or thin section structure. In an exemplary embodiment, where the secondary battery structure manufactured is a lithium secondary battery and the second active material element 140b is an anode active material, the second active material element 140b may include at least of materials, for example, lithium (Li), silicon (Si), and carbon (C). In one exemplary embodiment, for example, the second active material element 140b may be a Li thin film. However, this is merely exemplary, and any material that may be used as an anode active material in a secondary battery may be used for the second active material element 140b. The size or width of the second active material element 140b may be greater than that of each of the first active material elements 140a. Although an exemplary embodiment where the first active material elements 140a and the second active material element 140b have different structures is described above, the first active material elements 140a and the second active material element 140b may have the same or similar shape.

Figure 34E:
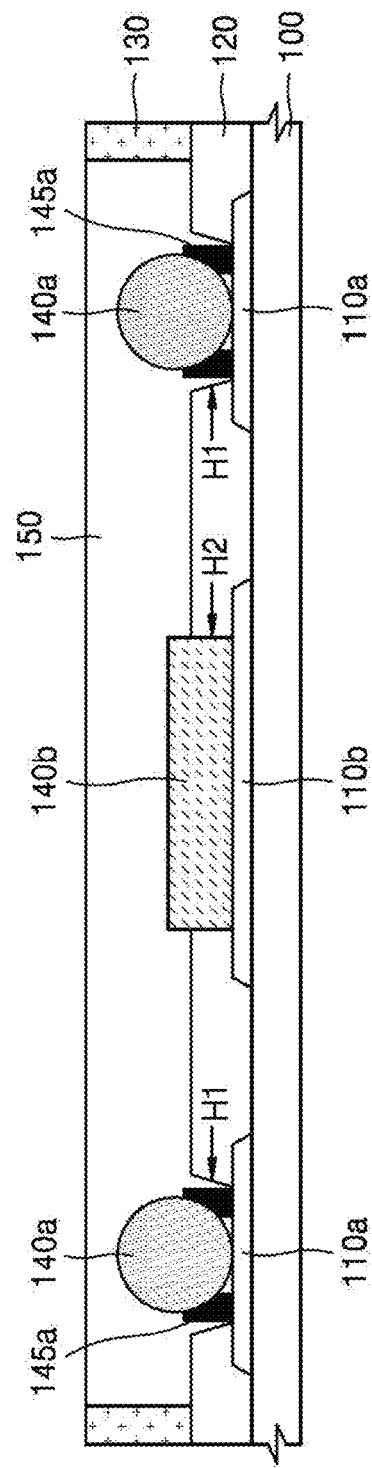

Referring to FIG. 34E, an electrolyte 150 contacting the first and second active material elements 140a and 140b may be provided on the insulation layer 120. The electrolyte 150 may be disposed inside of the guide pattern 130. The electrolyte 150 may be a liquid electrolyte or a solid electrolyte. In an exemplary embodiment, where the electrolyte 150 is a solid electrolyte, the guide pattern 130 may be omitted. The first active material elements 140a may be electrochemically and parallelly connected to the second active material element 140b via the electrolyte 150. The first electrode portions 110a and the first active material elements 140a corresponding thereto may constitute the first electrode element, and similarly, the second electrode portion 110b and the second active material element 140b corresponding thereto may constitute the second electrode element.

Although the exemplary embodiment of FIGS. 34A to 34E describes a method of manufacturing the secondary battery structure of FIG. 2, the secondary battery structure of FIG. 13 may be manufactured by modifying the method of FIGS. 34A to 34E. Also, various secondary battery structures described with reference to FIGS. 5 to 12 and FIGS. 14 to 22 may be manufactured by modifying such an embodiment of the method described above. Since the modification of the method may be easily carried out by those skilled in the art, detailed descriptions thereof will be omitted.

An exemplary embodiment of a method of testing a secondary battery structure as illustrated in FIG. 34E will hereinafter be described. The structure as illustrated in FIG. 34D may be dipped in a predetermined electrolyte solution and electrically connected to an electrochemical analysis apparatus, for example, a potentiostat apparatus. In such an embodiment, the electrolyte solution may correspond to the electrolyte 150 of FIG. 34E. The electrolyte solution may be, for example, a solution in which $LiPF_6$ of a 1 M concentration is dissolved in a mixture solution of dimethyl carbonate ("DMC"), ethylene carbonate ("EC"), and fluoroethylene carbonate ("FEC"). Since a potential window to be used may vary according to the material of the first active material elements 140a, a voltage value may be set according to the material of the first active material elements 140a in use. In an exemplary embodiment, where an OLO is used as the first active material elements 140a, the voltage value may be in a range from about 2.5 volts (V) to about 4.7 V. In an exemplary embodiment, where $LiCoO_2$ is used as the first active material elements 140a, the voltage value may be in a range from about 2.0 V to about 4.3 V. In an exemplary embodiment, where the first active material elements 140a are a single particle, theoretical charge/discharge capacity varies according to the size of the particle. Accordingly, a charge/discharge test may be performed by appropriately setting a C-rate. However, the above-described charge/discharge test method is merely exemplary and the method may be modified in various ways.

Figure 35:
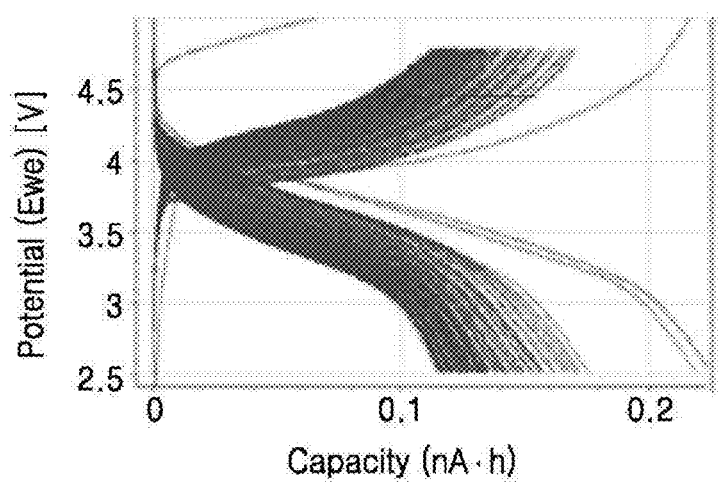
FIG. 35 is a graph showing charge/discharge characteristics (potential-capacity characteristics) of a secondary battery structure according to an exemplary embodiment.

FIG. 35 is a graph showing charge/discharge characteristics (potential-capacity characteristics) of a secondary battery structure according to an exemplary embodiment. FIG. 35 is a graph showing potential (Ewe)-capacity characteristics during charge/discharge of a secondary battery structure according to an exemplary embodiment. In such an embodiment of a secondary battery structure, a single particle is included as a cathode active material. The diameter of a single particle was about 9 μm, and the characteristics were evaluated while performing a charge/discharge operation by about 80 times with a current of about 1.7 nanoampere (nA).

As shown in FIG. 35, a capacity of a level of about 0.18 nA is obtained by the single particle (cathode active material) included in the secondary battery structure. When the capacity is recalculated for each coin cell, the capacity may correspond to a level of about 107 milliampere per gram (mA/g).

Figure 36:
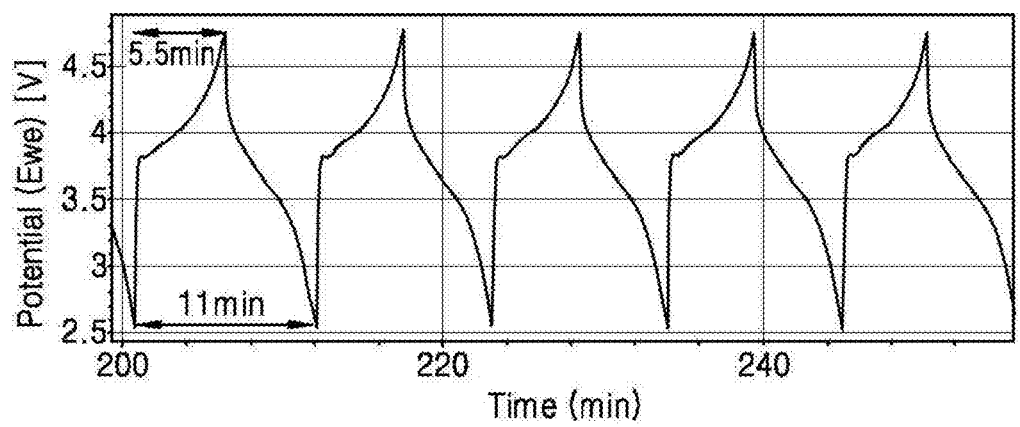
FIG. 36 is a graph shown charge/discharge characteristics (potential-time characteristics) of a secondary battery structure according to an exemplary embodiment.

FIG. 36 is a graph showing charge/discharge characteristics (potential-capacity characteristics) of a secondary battery structure according to an exemplary embodiment. FIG. 36 is a graph showing potential (Ewe)-capacity characteristics during charge/discharge of a secondary battery structure according to an exemplary embodiment. In such an embodiment of the secondary battery structure, a single particle is included as a cathode active material. The characteristics were evaluated while repeatedly performing charge/discharge within a voltage range of about 2.5 V to about 4.7 V in the secondary battery structure.

As shown in FIG. 36, about 11 minutes were taken for one-time charge/discharge: about 5.5 minutes for charge and about 5.5 minutes for discharge. The result was obtained by performing charge/discharge at the C-rate of 5 C. In a general battery including a coin cell of a related art, when a charge/discharge speed increases, that is, the C-rate increases, an appropriate charge/discharge capacity may not be obtained. However, in the secondary battery structure according to an exemplary embodiment, a charge/discharge performance of about 50% of a theoretical capacity may be obtained even at a fast charge/discharge speed of 5C. In such an embodiment, high-capacity performance may be maintained even at a fast charge speed. In such an embodiment, high-throughput analysis may be possible in the analysis of a material for a secondary battery.

Figure 37:
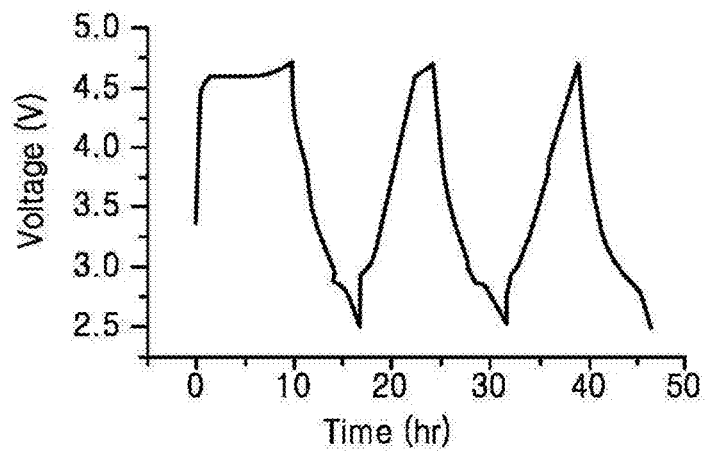
FIG. 37 is a graph showing charge/discharge characteristics of a secondary battery according to a comparative example.

FIG. 37 is a graph showing charge/discharge characteristics of a secondary battery according to a comparative example. FIG. 37 is a graph showing voltage-time characteristics during charge/discharge in a conventional secondary battery according to a comparative example. The conventional secondary battery according to a comparative example has a coin cell structure as described with reference to FIG. 31. As shown in FIG. 37, in the conventional secondary battery according to a comparative example, a one-time charge/discharge time is about 15 hours and thus the charge/discharge speed is very slow.

A general charge/discharge test is performed using a coil cell. In such a charge/discharge test, the test may be performed for a long time at a current of about 0.2 C that is as low as the C-rate. Since several hundred times of charge/discharge are typically performed to evaluate performance of a secondary battery, a slow charge/discharge speed may be undesired. In an exemplary embodiment, when a single particle (active material element) is contacted on a surface of a current collector (electrode), charge/discharge capacity may be stably measured at a fast charge/discharge speed. Accordingly, in such an embodiment, a charge/discharge evaluation time of a secondary battery may be substantially reduced. In one exemplary embodiment, for example, the charge/discharge evaluation time of a secondary battery may be reduced by more than 20 times compared to that of the conventional secondary battery.

According to exemplary embodiments as described above, efficiency of analysis and evaluation of materials for a secondary battery, that is, efficiency in research and development of a secondary battery may be substantially improved. In such embodiments, material analysis and electrochemical analysis with respect to materials for a secondary battery may be easily performed, and correlation therebetween may be easily obtained. Accordingly, high-throughput analysis may be possible, and a lead-time for development and production of a secondary battery may be much reduced. In an exemplary embodiment of the secondary battery structure, an abnormal operation in a local area in a cell is detected and controlled and thus problems such as abnormal heating, thermal runaway, explosion, or combustion may be prevented. Accordingly, stability and durability of a secondary battery may be substantially improved. In wearable/flexible/mobile batteries, obtaining stability may be desired. Accordingly, an exemplary embodiment of the secondary battery structure may be effectively included in wearable/flexible/mobile batteries. In addition, an exemplary embodiment of the secondary battery structure may be easily implemented as a small/thin film secondary battery structure having high performance.

Figure 38:
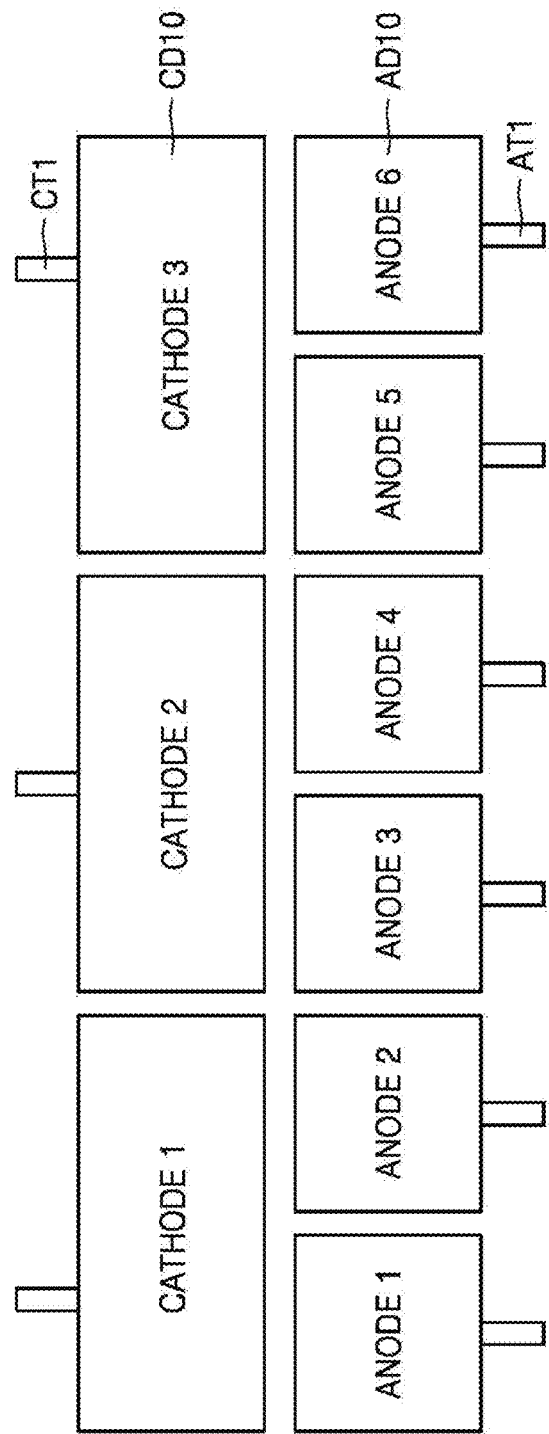
FIG. 38 is a plan view illustrating a battery structure according to another exemplary embodiment.

FIG. 38 is a plan view illustrating a battery structure according to another exemplary embodiment. In such an embodiment, the battery structure may have a single battery structure or single cell structure. In such an embodiment, the battery structure may be a multi-electrode single cell. In such an embodiment, the battery structure may be a secondary battery.

Referring to FIG. 38, in an exemplary embodiment, the battery structure may include a plurality of cathode elements CD10 spaced apart from each other, and a plurality of anode elements AD10 spaced apart from each other. The number of the cathode elements CD10 and the number of the anode elements AD10 may be different from each other. In an exemplary embodiment, one of the cathode elements CD10 and the anode elements AD10 may be provided in singular, that is, the battery structure may include only a single cathode element CD10 or only a single anode element AD10. Although not illustrated, an electrolyte for the movement of ions between the cathode elements CD10 and the anode elements AD10 maybe further included in the secondary battery structure. The anode elements AD10 may be electrochemically and parallelly connected to each of the cathode elements CD10 via the electrolyte. The numbers of the cathode elements CD10 and the anode elements AD10 are merely exemplary, and the number thereof, array method thereof, and arrangement relation therebetween may be modified in various ways. Alternatively, the structures of the cathode elements CD10 and the anode elements AD10 may be switched each other.

In an exemplary embodiment, each of the cathode elements CD10 may include a cathode tap CT1 protruding from one side thereof. In such an embodiment, each of the anode elements AD10 may include an anode tap AT1 protruding from one side thereof. In one exemplary embodiment, for example, the cathode tap CT1 and the anode tap AT1 may extend in opposite directions, respectively, but not being limited thereto. In an alternative exemplary embodiment, the positions and extension directions of the cathode tap CT1 and the anode tap AT1 may vary. The cathode tap CT1 and the anode tap AT1 may be referred to as the cathode terminal and the anode terminal, respectively.

Figure 39:
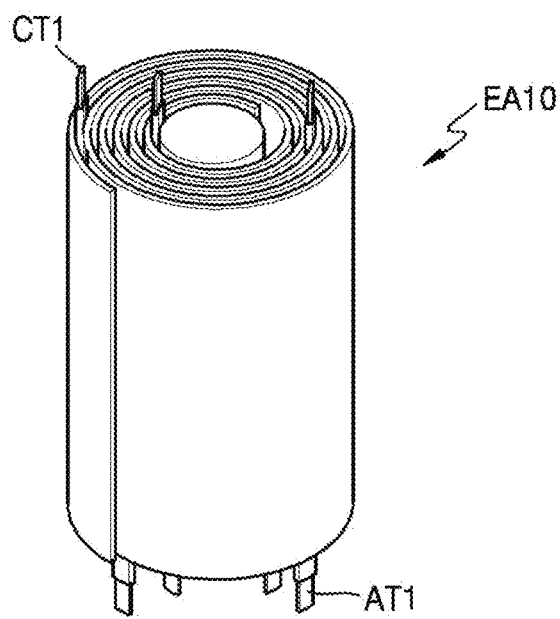
FIG. 39 is a perspective view illustrating a battery structure according to another exemplary embodiment.

In an exemplary embodiment of the battery structure as illustrated in FIG. 38, the cathode elements CD10 and the anode elements AD10 may be assembled in a predetermined method. In one exemplary embodiment, for example, the cathode elements CD10 and the anode elements AD10 may be wound or folded with a predetermined separator interposed therebetween, forming a predetermined electrode assembly. FIG. 39 illustrates an exemplary embodiment of the electrode assembly assembled by such a method described above.

Referring to FIG. 39, in an exemplary embodiment, a plurality of cathode elements and a plurality of anode elements are wound with a separator interposed therebetween, thereby forming an electrode assembly EA10. The electrode assembly EA10 may include, for example, the cathode elements CD10 and the anode elements AD10 as described above with reference to FIG. 38. The electrode assembly EA10 may be a jelly-roll structure as illustrated in FIG. 38, but may have a different structure. The cathode tap CT1 may protrude from one surface, for example, an upper surface, of the electrode assembly EA10, and the anode tap AT1 may protrude from another surface, for example, an opposing surface or a lower surface, of the electrode assembly EA10. The numbers of the cathode tap CT1 and the anode tap AT1 may be different from each other. The numbers and array method of the cathode tap CT1 and the anode tap AT1 may be variously modified.

Figure 40:
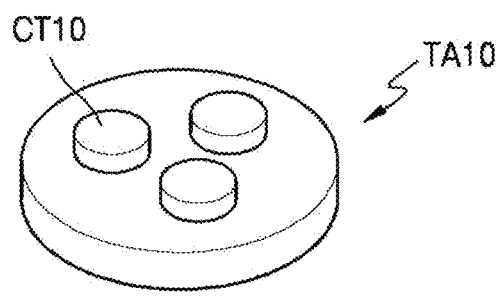
FIG. 40 is a perspective view exemplarily illustrating a first terminal assembly applicable to a battery structure according to an exemplary embodiment.
Figure 41:
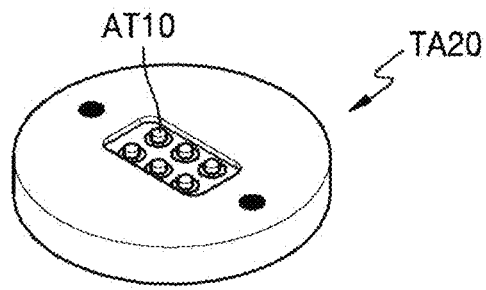
FIG. 41 is a perspective view exemplarily illustrating a second terminal assembly applicable to a battery structure according to an exemplary embodiment.

The electrode assembly EA10 of FIG. 39 may be accommodated in a predetermined battery case and opposing ends thereof may be sealed by a terminal assembly. FIG. 40 is a perspective view exemplarily illustrating a first terminal assembly TA10 coupled to an upper end portion of the electrode assembly EA10 of FIG. 39. FIG. 41 is a perspective view exemplarily illustrating a second terminal assembly TA20 coupled to a lower end portion of the electrode assembly EA10 of FIG. 39. FIG. 40 is a perspective view of an upper surface portion of the first terminal assembly TA10, and FIG. 41 is a perspective view of a lower surface portion of the second terminal assembly TA20.

Referring to FIG. 40, the first terminal assembly TA10 may include a plurality of cathode terminals CT10 spaced apart from each other. The cathode terminals CT10 may be connected to the cathode tap CT1 of FIG. 39. The first terminal assembly TA10 may be a type of cap assembly.

Referring to FIG. 41, the second terminal assembly TA20 may include a plurality of anode terminals AT10 spaced apart from each other. The anode terminals AT10 may be connected to the anode tap AT1 of FIG. 39.

Figure 42:
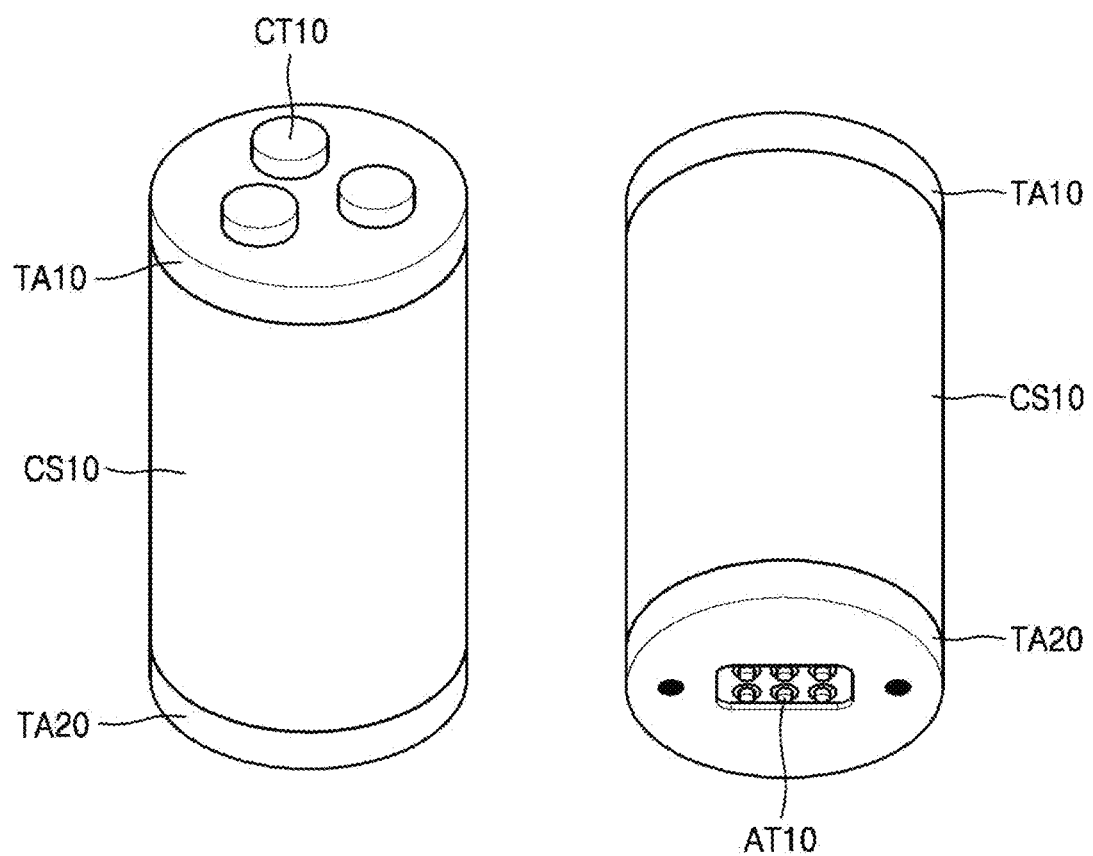
FIG. 42 are perspective views illustrating a battery structure according to another exemplary embodiment.

FIG. 42 is perspective views illustrating a case in which the electrode assembly EA10 of FIG. 39 is inserted in a predetermined battery case CS10 and the opposite ends thereof are sealed by the terminal assemblies TA10 and TA20 as described above with reference to FIGS. 40 and 41. In FIG. 42, the left image is a top perspective view of the case, and the right image is a bottom perspective view thereof. The shape and structure of the electrode assembly EA10 of FIG. 39 may be modified in various ways. Accordingly, the shape of the battery case CS10 may be modified in various ways. In one exemplary embodiment, for example, the battery case CS10 may have various shapes such as a cylindrical shape, an angled shape, a pouch shape, or a thin-film shape.

Figure 43:
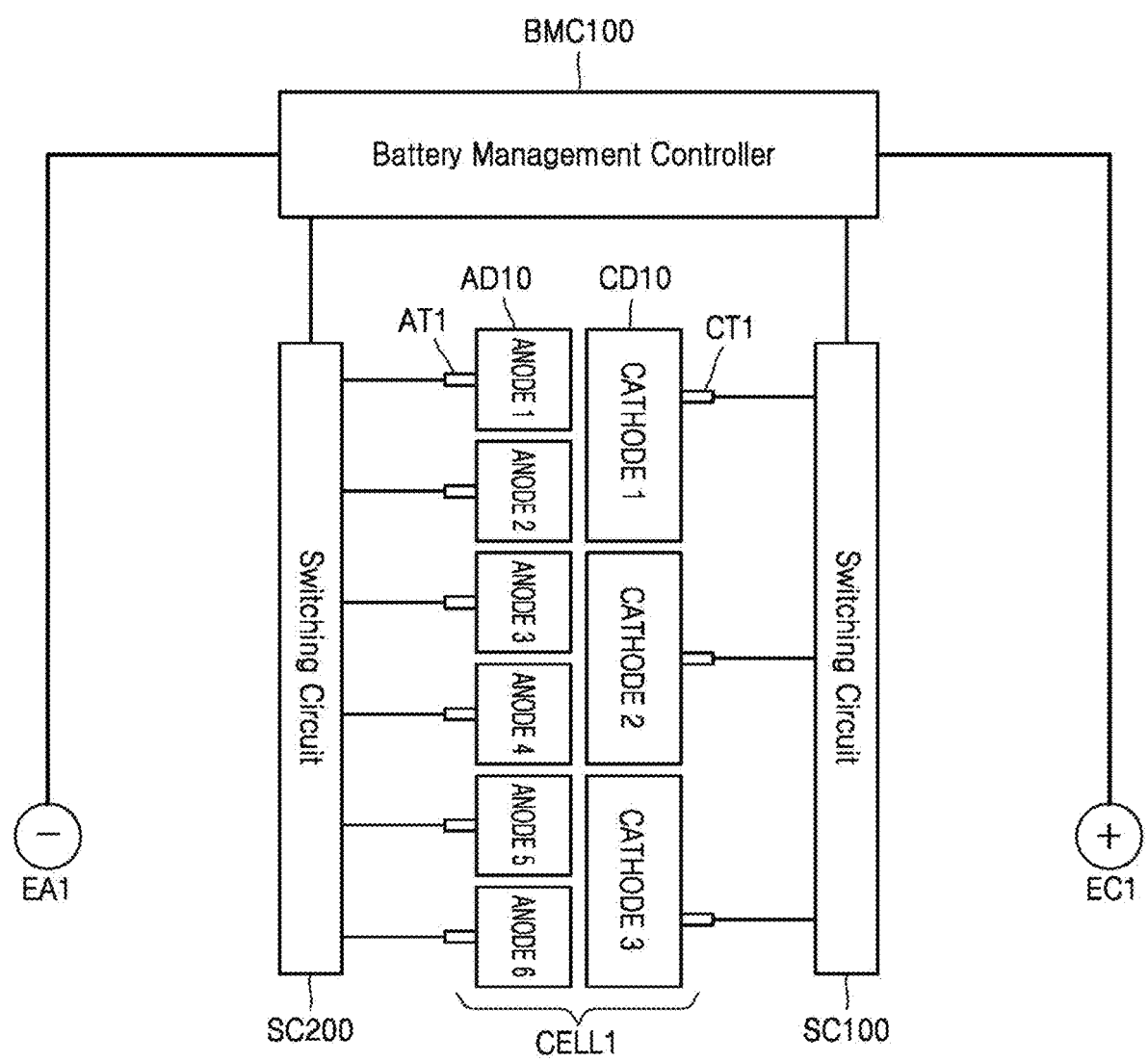
FIG. 43 illustrates a battery system according to an exemplary embodiment.

FIG. 43 illustrates a battery system according to an exemplary embodiment.

Referring to FIG. 43, the battery system may include a single battery structure CELL1, and a battery management system ("BMS") connected to the single battery structure CELL1. The single battery structure CELL1 may have, for example, the structure described with reference to FIG. 38. The BMS may include a first switching circuit unit SC100 connected to the cathode taps CT1 or the cathode terminals CT10 and a second switching circuit unit SC200 connected to the anode taps AT1 or the anode terminals AT10. Also, the BMS may include a battery management controller BMC100 connected to the first and second switching circuit units SC100 and SC200. The first switching circuit unit SC100 may include a circuit configuration capable of individually or independently turning on/off the cathode elements CD10. In such an embodiment, the second switching circuit unit SC200 may include a circuit configuration capable of individually or independently turning on/off the anode elements AD10. The battery management controller BMC100 may control the operations of the first and second switching circuit unit SC100 and SC200. In such an embodiment, the battery management controller BMC100 may periodically monitor the output voltages of the electrodes CD10 and AD10. When an abnormal electrode is detected, the battery management controller BMC100 may selectively block electric connection of the abnormal electrode and include a circuit configuration to this end. Accordingly, the problems such as heating, combustion, life shortening, due to an abnormal electrode or an abnormal active material element connected thereto.

An external cathode terminal EC1 and an external anode terminal EA1 may be connected to the battery management controller BMC100. The external cathode terminal EC1 may be connected to the cathode elements CD10 via the battery management controller BMC100 and the first switching circuit unit SC100. The external anode terminal EA1 may be connected to the anode elements AD10 via the battery management controller BMC100 and the second switching circuit unit SC200.

In an exemplary embodiment, the single battery structure CELL1 may have an assembled shape as illustrated in FIG. 42. In such an embodiment, the cathode terminals CT10 shown in FIG. 42 may be connected to the first switching circuit unit SC100, and the anode terminals AT10 may be connected to the second switching circuit unit SC200. The single battery structure CELL1 of FIG. 43 is merely exemplary and may be modified in various ways. In exemplary embodiments, the numbers of the cathode elements CD10 and the anode elements AD10 may vary, and one of the cathode elements CD10 and the anode elements AD10 may be provided in singular, that is, not provided in plural.

Although some exemplary embodiments are described herein in detail, one or ordinary skill in the art may variously modify the secondary battery structure described with reference to FIGS. 1 to 23 and FIGS. 32 and 33. In one exemplary embodiment, for example, the number of the first electrode elements and the number of the second electrode elements may be the same, and the MEA may be applied to either the first electrode element (ex, cathode) or the second electrode element (ex, anode), or to both of the electrodes. The first active material element may have various configurations other than a single particle, and the second active material element may have various configurations other than a thin film/thin section. Also, the method of manufacturing a secondary battery structure described with reference to FIGS. 34A to 34E may be variously modified. In addition, a method of operating a secondary battery structure according to an exemplary embodiment or an analysis and evaluation method using the operation method may be modified in various ways. Also, the battery structure described with reference to FIGS. 38 to 43, and the structure of a battery system including the battery structure, may be modified in various ways. Therefore, it will be understood by those of ordinary skill in the art that various changes in form and details may be made therein without departing from the spirit and scope of the invention as defined by the following claims.

What is claimed is:

1. A single battery structure comprising:
   a substrate;
   a plurality of first electrode elements disposed on the substrate and spaced apart from each other;
   a second electrode element disposed on the substrate and spaced apart from the plurality of first electrode elements when viewed from a plan view in a thickness direction of the substrate;
   a plurality of first electrode terminals connected to the plurality of first electrode elements, respectively; and
   a second electrode terminal connected to the second electrode element,
   wherein one of the first electrode terminals and the second electrode terminal is a cathode terminal, and the other of the first electrode terminals and the second electrode terminal is an anode terminal.

2. The single battery structure of claim 1, wherein the number of the second electrode element and the number of the first electrode elements are different from each other.

3. The single battery structure of claim 1, wherein the plurality of first electrode elements is electrochemically and parallelly connected to the second electrode element via an electrolyte.

4. The single battery structure of claim 1, wherein the single battery structure is a secondary battery structure.

5. A battery system comprising:
   the single battery structure of claim 1; and
   a battery management system connected to the single battery structure.

6. The battery system of claim 5, wherein the battery management system comprises:

a first switching circuit unit connected to the plurality of first electrode terminals;
a second switching circuit unit connected to the second electrode terminal; and
a battery management controller connected to the first and second switching circuit units, wherein the battery management controller controls operations of the first and second switching circuit units.

* * * * *